(12) United States Patent
Kim et al.

(10) Patent No.: US 11,569,201 B2
(45) Date of Patent: Jan. 31, 2023

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Hyoeun Kim, Cheonan-si (KR); Ji Hwang Kim, Cheonan-si (KR); Jisun Yang, Hwaseong-si (KR); Seunghoon Yeon, Suwon-si (KR); Chajea Jo, Yongin-si (KR); Sang-Uk Han, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/509,750

(22) Filed: Oct. 25, 2021

(65) Prior Publication Data

US 2022/0045033 A1  Feb. 10, 2022

Related U.S. Application Data

(63) Continuation of application No. 16/298,476, filed on Mar. 11, 2019, now Pat. No. 11,158,603.

(30) Foreign Application Priority Data

Aug. 8, 2018  (KR) .................. 10-2018-0092589

(51) Int. Cl.
*H01L 25/065* (2006.01)
*H01L 23/00* (2006.01)
*H01L 23/538* (2006.01)

(52) U.S. Cl.
CPC ...... *H01L 25/0652* (2013.01); *H01L 23/5383* (2013.01); *H01L 24/32* (2013.01)

(58) Field of Classification Search
CPC . H01L 25/0652; H01L 23/5383; H01L 24/32; H01L 24/29; H01L 24/08;
(Continued)

(56) References Cited

U.S. PATENT DOCUMENTS 9,013,040 B1  4/2015  Schmidt
9,685,480 B2  6/2017  Yamagishi
(Continued)

FOREIGN PATENT DOCUMENTS

KR   20120087651 A   8/2012

OTHER PUBLICATIONS

Examination Report dated Oct. 3, 2022 From the Korean Patent Office Cited in Corresponding Korean Application.

*Primary Examiner* — Thanh Y. Tran
(74) *Attorney, Agent, or Firm* — Volentine, Whitt & Francos, PLLC

(57) ABSTRACT

A semiconductor package includes a first semiconductor chip, a second semiconductor chip on the first semiconductor chip, a first semiconductor structure and a second semiconductor structure that are on the first semiconductor chip and spaced apart from each other across the second semiconductor chip, and a resin-containing member between the second semiconductor chip and the first semiconductor structure and between the second semiconductor chip and the second semiconductor structure. The semiconductor package may be fabricated at a wafer level.

20 Claims, 25 Drawing Sheets

(58) Field of Classification Search
CPC . H01L 2224/08145; H01L 2224/16145; H01L 24/73; H01L 2224/32106; H01L 2224/32137; H01L 2224/32145
See application file for complete search history.

(56) References Cited

U.S. PATENT DOCUMENTS

| | | |
|---|---|---|
| 9,689,863 B2 | 6/2017 | Yu et al. |
| 9,847,285 B1 | 12/2017 | Sung et al. |
| 2010/0261313 A1 | 10/2010 | Toh et al. |
| 2010/0308474 A1 | 12/2010 | Shibuya et al. |
| 2011/0215470 A1 | 9/2011 | Chen et al. |
| 2011/0291266 A1* | 12/2011 | Jin ................ H01L 23/481 257/737 |
| 2012/0018871 A1 | 1/2012 | Lee et al. |
| 2012/0193779 A1 | 8/2012 | Lee et al. |
| 2012/0281113 A1 | 11/2012 | Kennedy et al. |
| 2013/0208426 A1 | 8/2013 | Kim et al. |
| 2013/0234310 A1 | 9/2013 | Youn et al. |
| 2013/0344627 A1 | 12/2013 | Kim et al. |
| 2015/0108653 A1 | 4/2015 | Hooper et al. |
| 2015/0255427 A1 | 9/2015 | Sung et al. |
| 2015/0369798 A1 | 12/2015 | Yu et al. |
| 2017/0092680 A1* | 3/2017 | Kwon ............. H01L 27/1462 |
| 2017/0288481 A1 | 10/2017 | Yamagishi |
| 2018/0033813 A1 | 2/2018 | Suzuki et al. |
| 2019/0214328 A1 | 7/2019 | Eid |
| 2019/0385929 A1 | 12/2019 | Ku et al. |
| 2020/0006324 A1* | 1/2020 | Chen ............... H01L 27/0688 |
| 2020/0266146 A1* | 8/2020 | Nishida ........... H01L 23/5283 |

\* cited by examiner

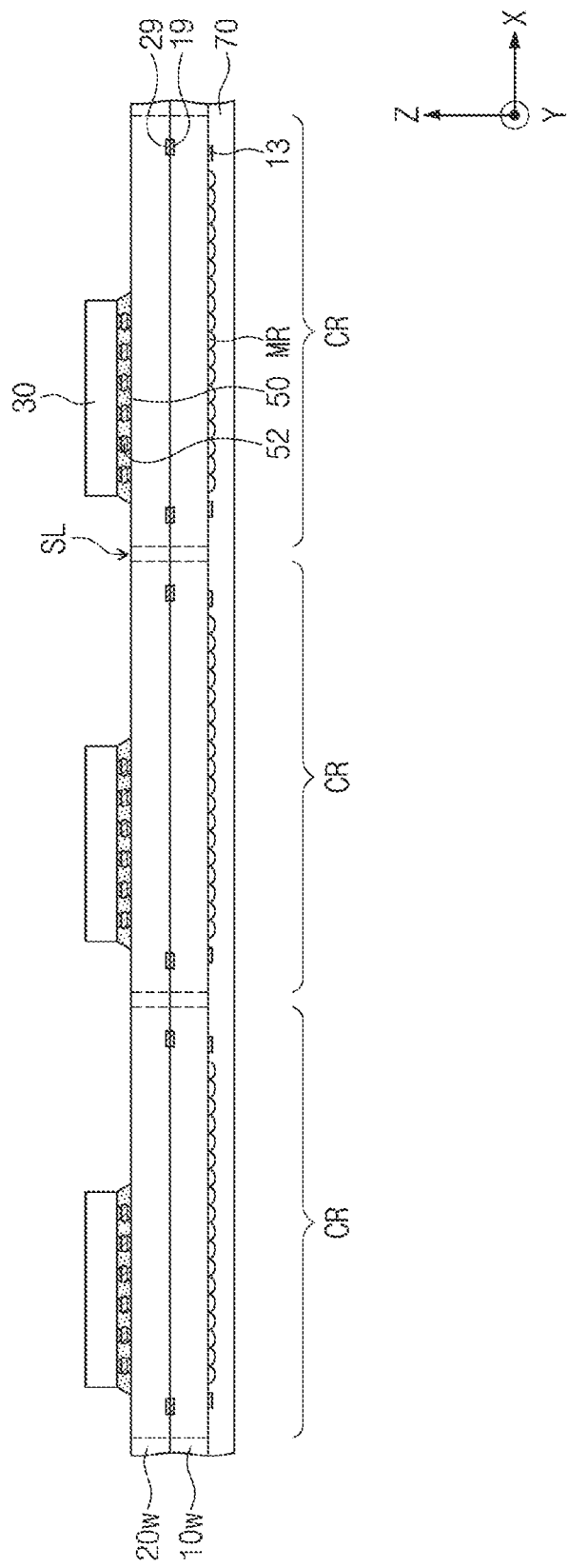

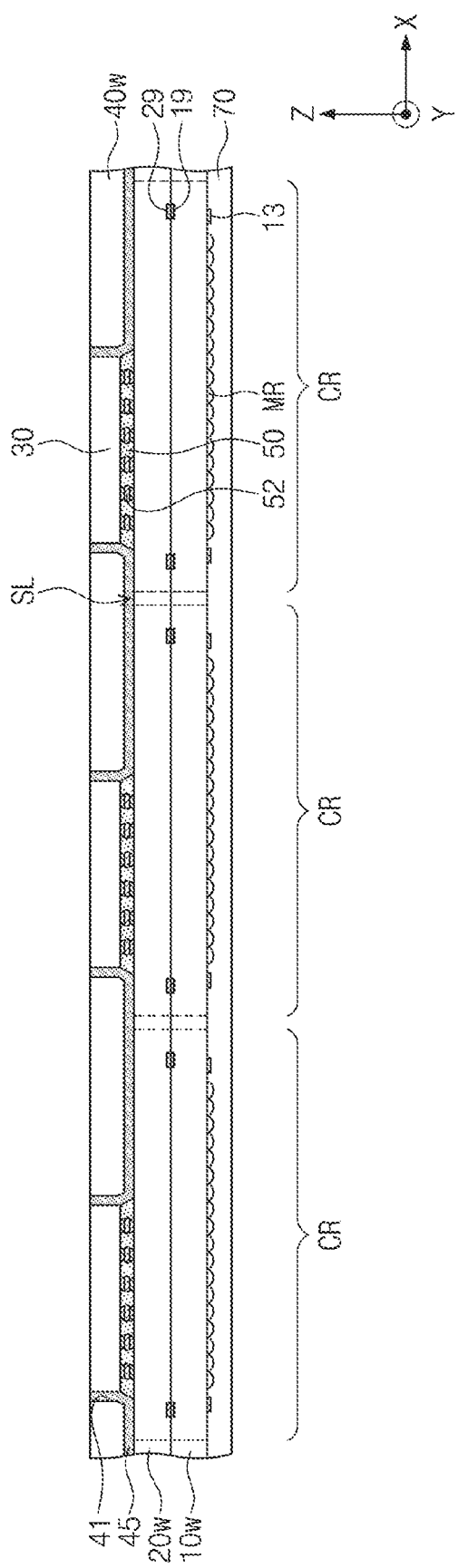
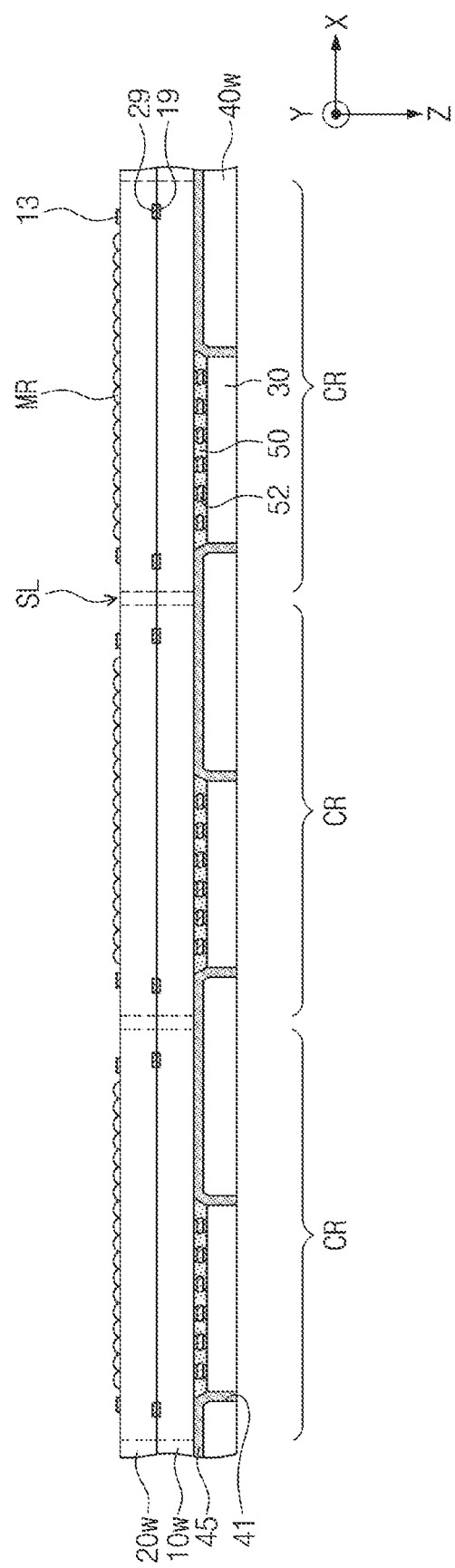
FIG. 6I
FIG. 6J

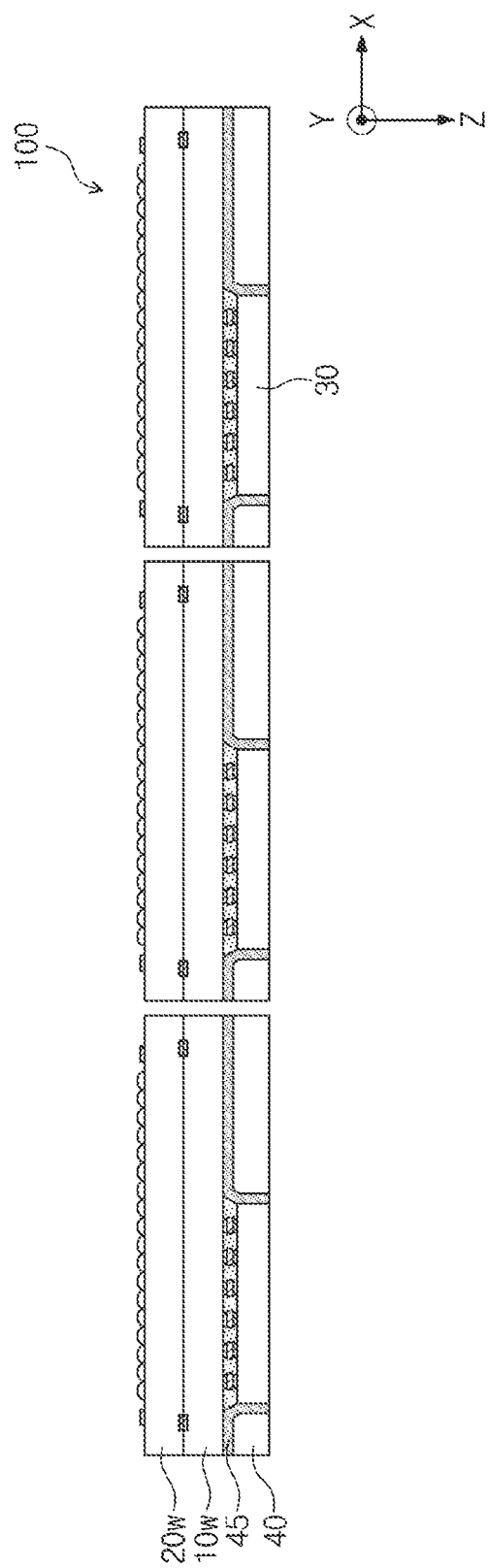

SEMICONDUCTOR PACKAGE AND METHOD OF FABRICATING THE SAME

PRIORITY STATEMENT

This is a Continuation of U.S. application Ser. No. 16/298,476, filed Mar. 11, 2019, and a claim of priority under 35 U.S.C § 119 is made to Korean Patent Application No. 10-2018-0092589 filed on Aug. 8, 2018 in the Korean Intellectual Property Office, the entire contents of which are hereby incorporated by reference.

BACKGROUND

The present inventive concepts relate to a semiconductor package and a method of fabricating the same. More particularly, the present inventive concepts relate to a multi-chip package in which chips are stacked one on another and a method of fabricating the same.

A semiconductor package allows an integrated circuit chip to be used in electronic products. A semiconductor package is typically configured such that at least one semiconductor chip is mounted on a printed circuit board (PCB) and bonding wires or bumps are used to electrically connect the semiconductor chip to the printed circuit board. As the electronics industry continues to evolve, many studies are being conducted to increase the capacity and functionality of semiconductor packages and to improve the reliability and durability of semiconductor packages.

SUMMARY

According to the present inventive concepts, there is provided a semiconductor package comprising a first semiconductor chip, a second semiconductor chip on the first semiconductor chip, a first semiconductor structure and a second semiconductor structure that are on the first semiconductor chip and spaced apart from each other, the second semiconductor chip being interposed between the first semiconductor structure and the second semiconductor structure, and a resin-containing member interposed between the second semiconductor chip and the first semiconductor structure and interposed between the second semiconductor chip and the second semiconductor structure.

According to another aspect of the present inventive concepts, there is provided a semiconductor package comprising a first semiconductor chip, a second semiconductor chip mounted on the first semiconductor chip and having a width less than a width of the first semiconductor chip in a given direction, a semiconductor die on the first semiconductor chip and including an opening in which the second semiconductor chip is received, and a resin-containing member interposed between the second semiconductor chip and the semiconductor die.

According to still another aspect of the present inventive concepts, there is provided a semiconductor package comprising a first semiconductor chip, a second semiconductor chip mounted on the first semiconductor chip, a third semiconductor chip mounted on the second semiconductor chip and having a width less than a width of the second semiconductor chip in a given direction, a semiconductor die on the second semiconductor chip and extending around the third semiconductor chip, and a resin-containing member interposed between the semiconductor die and the third semiconductor chip.

According to yet another aspect of the present inventive concepts, there is provided a semiconductor package comprising a lower package structure including a lower semiconductor chip having a substrate, integrated circuitry at a surface of the substrate, and an interlayer dielectric on the substrate and covering the surface of the substrate, and an upper package structure stacked on the lower package structure. The upper package structure includes an upper semiconductor chip, segments of a die body of semiconductor material, and a resin-containing member. The upper semiconductor chip has a substrate, integrated circuitry at a surface of the substrate of the upper semiconductor chip and electrically connected to the integrated circuitry of the lower semiconductor chip, and an interlayer dielectric covering the surface of the substrate of the upper semiconductor chip, the interlayer dielectric of the upper semiconductor chip being interposed between the substrate of the upper semiconductor chip and the lower package structure. The resin-containing member extends circumferentially around the upper semiconductor chip and sandwiched between the upper semiconductor chip and the segments of the die body of semiconductor material.

BRIEF DESCRIPTION OF THE DRAWINGS

FIGS. 6A-6L illustrate examples of a wafer level method of fabricating a semiconductor package having a cross section similar to that of the package shown in FIG. 3, and in which:

FIG. 6A is a cross-sectional view of a substrate (wafer) during the course of fabricating semiconductor packages;

FIGS. 6B, 6D, 6F, 6H, and 6K are each a plan view of the substrate (wafer) during the course of fabricating the semiconductor packages;

FIG. 6C is a cross-sectional view taken along line B-B' of FIG. 6B;

FIG. 6E is a cross-sectional view taken along line B-B' of FIG. 6D;

FIG. 6G is a cross-sectional view taken along line B-B' of FIG. 6F.

FIG. 6I is a cross-sectional view taken along line B-B' of FIG. 6H;

FIG. 6J a cross-sectional view taken along line B-B' of FIG. 6H but with the structure inverted according to a step in the method I; and FIG. 6L is a cross-sectional view taken along line B-B' of FIG. 6K.

DETAILED DESCRIPTION

Figure 1:
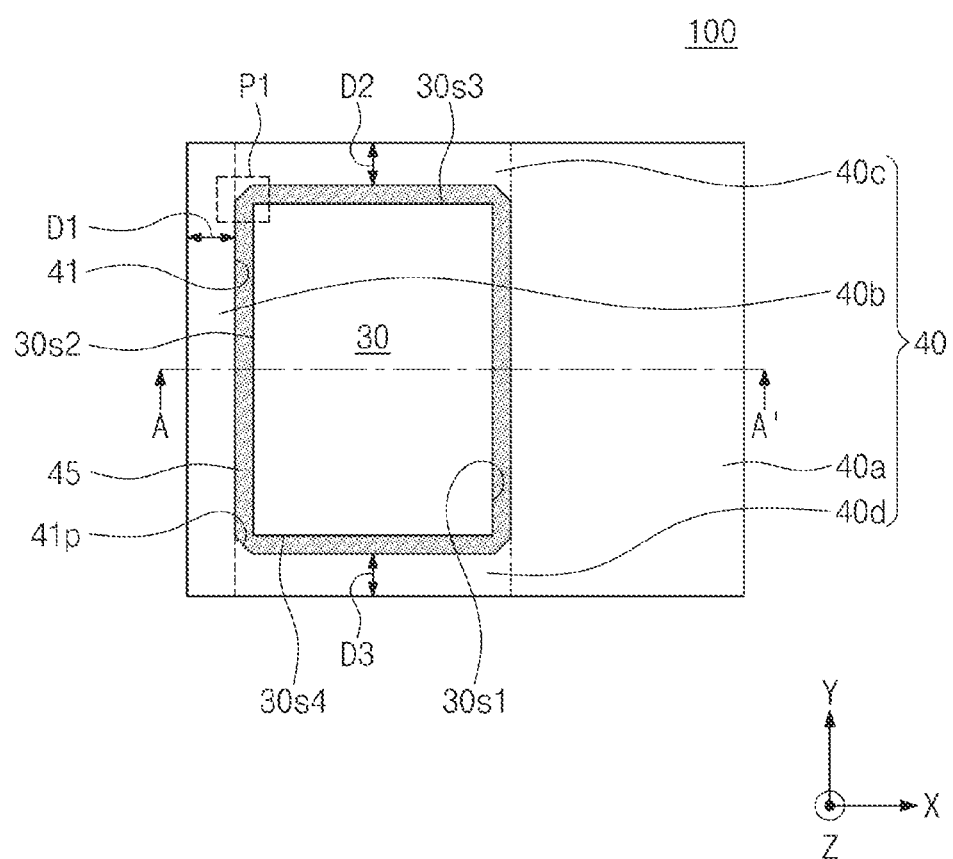
FIG. 1 is a plan view of an example of a semiconductor package according to the present inventive concepts.

Examples of the present inventive concepts will now be described in detail with reference to the accompanying drawings. The examples be described are illustrative only, i.e., are for use in explaining the present inventive concepts, and are not intended to be limiting. Also, in the description and claims that follow, ordinal numbers may be used merely to discriminate one discrete element or component from another. Therefore, a component such as a semiconductor chip may be termed a second semiconductor chip at one place in this disclosure, e.g., in the detailed description, but the same semiconductor chip may be termed a third semiconductor chip elsewhere in the disclosure, e.g., in the claims. Regardless, correspondence between the claim terms and elements and components referred to in the detailed description will be readily discerned. Also, spatial terms such as "upper" and "lower" are used in relation to orientations of the semiconductor packages as shown in the figures for ease of description and are thus not limiting as the semiconductor packages according to the inventive concepts may assume other orientations when in use.

Referring to FIGS. 1, 2A, 2B, and 3, an example of a semiconductor package 100 according to the present inventive concepts may include a first semiconductor chip 10, a second semiconductor chip 20, and a third semiconductor chip 30 that are sequentially stacked. The first semiconductor chip 10 may have side surfaces aligned with those of the second semiconductor chip 20. The first and second semiconductor chips 10 and 20 may have the same size. The first and second semiconductor chips 10 and 20 may be in contact with each other. The first semiconductor chip 10 may include a first upper terminal 19. The second semiconductor chip 20 may include a second lower terminal 29. The first upper terminal 19 and the second lower terminal 29 may be in contact with each other.

The third semiconductor chip 30 may be spaced apart from the second semiconductor chip 20. An under-fill layer 50 may be interposed between the second and third semiconductor chips 20 and 30. The under-fill layer 50 may include, for example, a thermosetting resin or a photo-curable resin. The under-fill layer 50 may further include an inorganic filler or an organic filler. The third semiconductor chip 30 may have a width less than that of the second semiconductor chip 20. The third semiconductor chip 30 may have a central axis that does not coincide with that of the second semiconductor chip 20. The central axis of a chip may be an axis that passes through a geometric centers of upper and lower major surfaces of the chip. In other words, the third semiconductor chip 30 may be laterally offset relative to the second semiconductor chip 20. Thus, the third semiconductor chip 30 may be disposed closer to one edge of the second semiconductor chip 20 than an opposite edge of the second semiconductor chip 20. The third semiconductor chip 30 may be mounted on the second semiconductor chip 20 through a connection member 52. The connection member 52 may comprise at least one of a conductive bump, a conductive pillar, and a solder ball. The connection member 52 may include one or more materials selected from the group consisting of copper, tin, and lead.

Figure 2A:
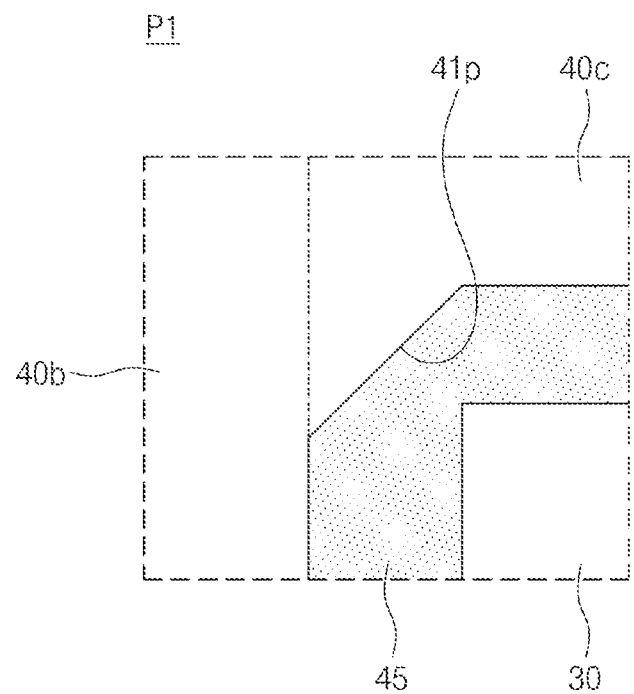
FIGS. 2A and 2B are enlarged views of different versions of section P1 of the package shown in FIG. 1.
Figure 2B:
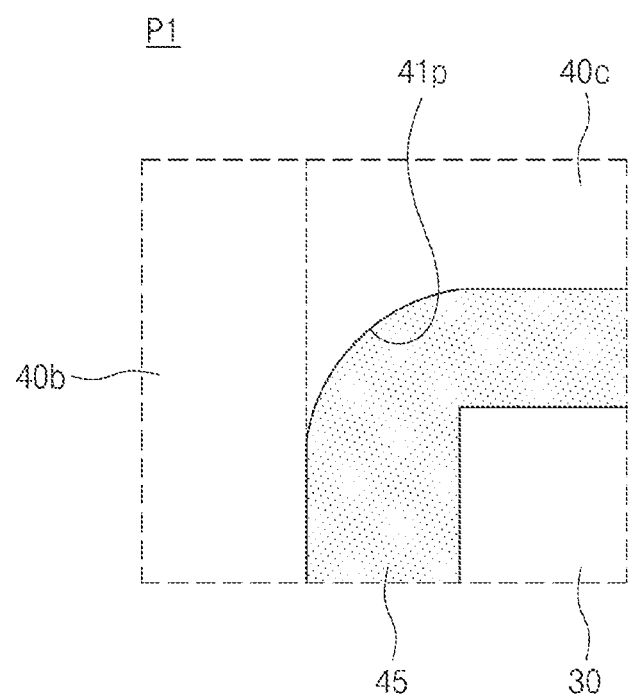

A semiconductor die 40 may be disposed on the second semiconductor chip 20. The semiconductor die 40 may include a first semiconductor structure 40a, a second semiconductor structure 40b, a third semiconductor structure 40c, and a fourth semiconductor structure 40d that are integral or unitary segments so as to together constitute a single body. The first semiconductor structure 40a may be spaced apart from the second semiconductor structure 40b, and the third semiconductor structure 40c may be spaced apart from the fourth semiconductor structure 40d, which configuration may delimit an opening 41. The opening 41 may have a corner 41p whose shape, when viewed in plan, is beveled as shown in FIG. 2A or round as shown in FIG. 2B. Accordingly, it may be possible to avoid concentration of physical stress at the corner 41p of the opening 41, and thus the semiconductor die 40 may be prevented from being cracked. As a result, the semiconductor package 100 may exhibit a high degree of reliability.

Also, note, in some examples of a semiconductor package according to the inventive concepts, the semiconductor "die" 40 may be blank, meaning that it does not contain or support circuitry. That is, as between a lower surface of the die 40 that faces the second semiconductor chip 20 and an upper surface of the die 40 that faces away from the second semiconductor chip 20 there may be no electrically conductive elements such as wiring or active or passive circuit components. Thus, in the present disclosure the term "die" may be understood as referring to a contiguous or segmented body of semiconductor material which may or may not include circuitry, i.e., an integrated circuit (IC). The term "die body" may be understood as referring to a substrate such as a semiconductor substrate.

The second semiconductor structure 40b may have a width D1 parallel to a first direction X. The third semiconductor structure 40c may have a width D2 parallel to a second direction Y intersecting the first direction X. The fourth semiconductor structure 40d may have a width D3 parallel to the second direction Y. Each of the widths D1, D2, and D3 may be, for example, equal to or greater than about 100 μm, such that the semiconductor package 100 has sufficient mechanical strength and efficiently radiates heat.

The third semiconductor chip 30 may be disposed in the opening 41. The third semiconductor chip 30 may have a first side surface 30s1 and a second side surface 30s2 that face in opposite directions, a third side surface 30s3 that connects one end of the first side surface 30s1 to one end of the second side surface 30s2, and a fourth side surface 30s4 that faces in a direction opposite to the direction in which the third side surface 30s3 faces. The first, second, third, and fourth semiconductor structures 40a, 40b, 40c, and 40d may be adjacent respectively to the first, second, third and fourth side surfaces 30s1, 30s2, 30s3, and 30s4.

The semiconductor die 40 may include the same material as that of a semiconductor substrate of each of the first and second semiconductor chips 10 and 20. For example, the semiconductor die 40 may be a single crystalline silicon substrate. A resin-containing member 45 may be interposed between the semiconductor die 40 and the third semiconductor chip 30. The resin-containing member 45 may be a mold layer, an adhesive layer, a thermal interface material layer, or a double-sided tape. The resin-containing member 45 may include a thermosetting resin or a photocurable resin. When the resin-containing member 45 is a mold layer or a thermal interface material layer, the resin-containing member 45 may further include an inorganic filler or an organic filler. The resin-containing member 45 may surround the third semiconductor chip 30. The resin-containing member 45 may be interposed between the semiconductor die 40 and the second semiconductor chip 20. The semiconductor die 40 may be spaced apart and electrically insulated from the second semiconductor chip 20. Top surfaces of the third semiconductor chip 30, the semiconductor die 40, and the resin-containing member 45 may be coplanar with each other.

Figure 3:
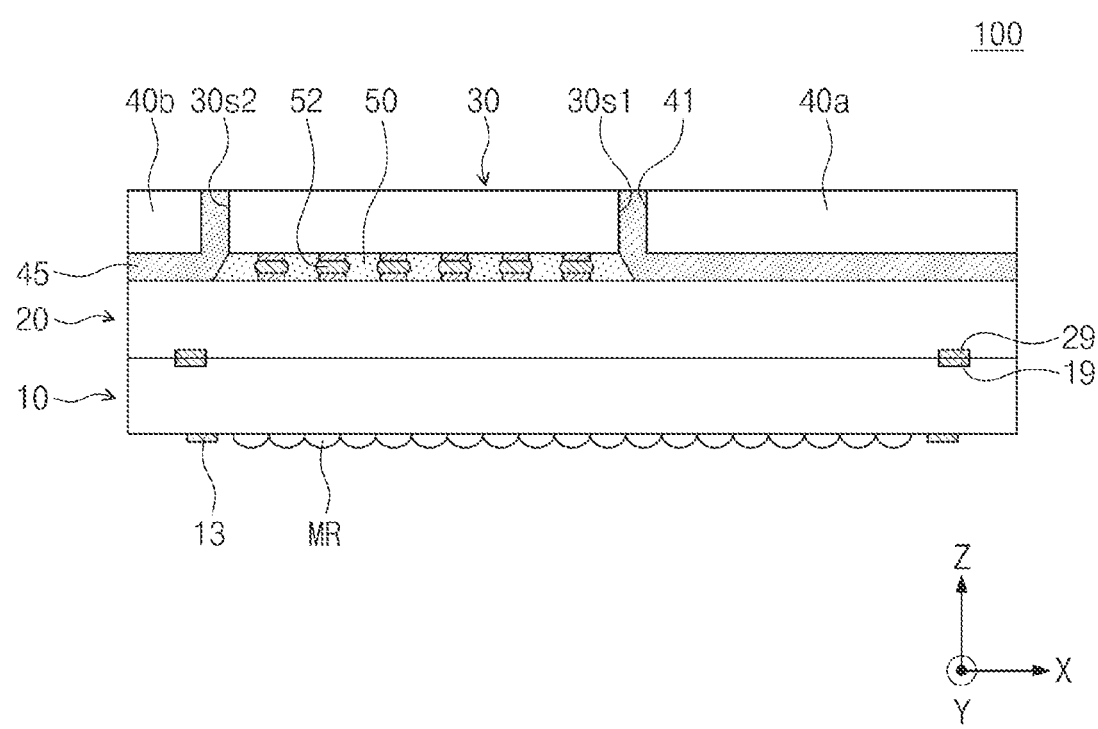
FIG. 3 is a cross-sectional view taken along line A-A' of FIG. 1.
Figure 4:
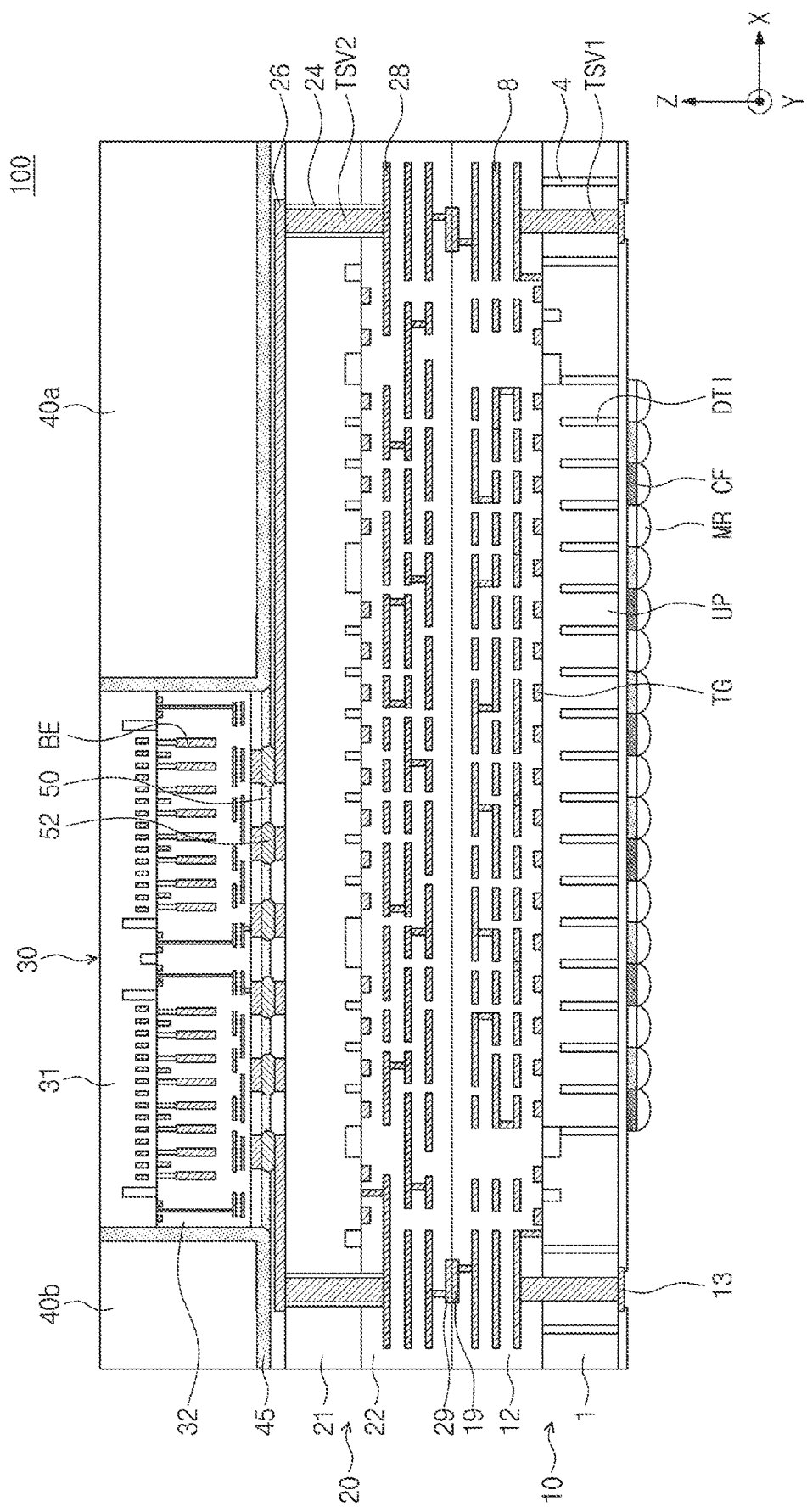
FIG. 4 is a detailed view of FIG. 3.

Referring to FIGS. 3 and 4, the first semiconductor chip 10 may be, for example, an image sensor chip. The second semiconductor chip 20 may be, for example, a logic chip that drives the first semiconductor chip 10. The third semiconductor chip 30 may be, for example, a memory chip that stores electrical signals generated in the first and second semiconductor chips 10 and 20. More specifically, the third semiconductor chip 30 may be a dynamic random access memory (DRAM) chip.

The first semiconductor chip 10 may include a first semiconductor substrate 1 and a first interlayer dielectric 12 disposed on the first semiconductor substrate 1. The first interlayer dielectric 12 may be a multi-dielectric-layered structure (a plurality of first interlayer dielectric layers) including one or more of a silicon oxide layer, a silicon nitride layer, a silicon oxynitride layer, and a porous low-k dielectric layer. The first semiconductor substrate 1 may be provided therein with deep device isolation layers DTI that separate a plurality of unit pixels UP from each other. Although not shown, the first semiconductor substrate 1 may include therein a plurality of photodiode regions each of which is disposed in a corresponding one of the unit pixels UP.

The semiconductor package 100 may be provided with color filters CF, corresponding to the unit pixels UP, under the first semiconductor substrate 1. A micro-lens array MR may be disposed on the color filters CF. A transfer gate TG that transfers charges generated in the photodiode region may be provided on the first semiconductor substrate 1. A plurality of first wiring lines 8 may be disposed in the first interlayer dielectric 12. A first through via TSV1 that extends through the first semiconductor substrate 1 may be provided adjacent the periphery of the first semiconductor substrate 1. The first through via TSV1 may extend into the first interlayer dielectric 12 to contact and electrically connect with the first wiring line 8. A first via dielectric layer 4 may be disposed adjacent to the first through via TSV1.

The first via dielectric layer 4 may be spaced apart from the first through via TSV1. Although not shown, when viewed in plan, the first via dielectric layer 4 may surround the first through via TSV1. The first via dielectric layer 4 may insulate the first through via TSV1 from the first semiconductor substrate 1. The first via dielectric layer 4 may extend through the first semiconductor substrate 1. A first lower conductive pad 13 may be disposed beneath the first through via TSV1.

The second semiconductor chip 20 may include a second semiconductor substrate 21 and a second interlayer dielectric 22 on the second semiconductor substrate 21. The second interlayer dielectric 22 may be a multi-dielectric-layered structure (a plurality of second interlayer dielectric layers) including one or more of a silicon oxide layer, a silicon nitride layer, a silicon oxynitride layer, and a porous low-k dielectric layer. The second semiconductor substrate 21 may be provided with a plurality of transistors. The transistors may be electrically connected to multi-layered second wiring lines 28 disposed in the second interlayer dielectric 22. The second semiconductor chip 20 may further include a second through via TSV2, which second through via TSV2 may extend through an outer peripheral region of the second semiconductor substrate 21 and may electrically connect the second wiring line 28 to a redistribution pattern 26. A second via dielectric layer 24 may extend through the second semiconductor substrate 21 and surround the second through via TSV2. The second via dielectric layer 24 may be in contact with the second through via TSV2.

The multi-layered first interlayer dielectric 12 may have an uppermost dielectric layer in contact with that of the multi-layered second interlayer dielectric 22.

The third semiconductor chip 30 may include a third semiconductor substrate 31 and a third interlayer dielectric 32 disposed on the third semiconductor substrate 31. The third interlayer dielectric 32 may be a multi-dielectric-layered structure including one or more of a silicon oxide layer, a silicon nitride layer, a silicon oxynitride layer, and a porous low-k dielectric layer. Capacitors including bottom electrodes BE may be provided in the third interlayer dielectric 32.

According to the present inventive concepts, the semiconductor package 100 may be configured such that the semiconductor die 40 consists of the same semiconductor material as the first, second, and third semiconductor chips 10, 20, and 30, and that the resin-containing member 45 occupies a relatively small area or space especially in the plane of the third semiconductor chip 30, which may enhance the mechanical strength of the semiconductor package 100. In addition, because the semiconductor die 40 consists of a semiconductor material, such as silicon, whose coefficient of thermal expansion is less than that of a resin constituent, warping of the semiconductor package 100 may be minimized or prevented. Furthermore, because the semiconductor die 40 consists of a semiconductor material, such as silicon, whose thermal conductivity is greater than that of a resin constituent, heat may be effectively discharged to reduce the likelihood of malfunction and to allow the semiconductor package 100 to be operated at a relatively high speed. As a result, the semiconductor package 100 may have excellent reliability and operational characteristics.

Figure 5A:
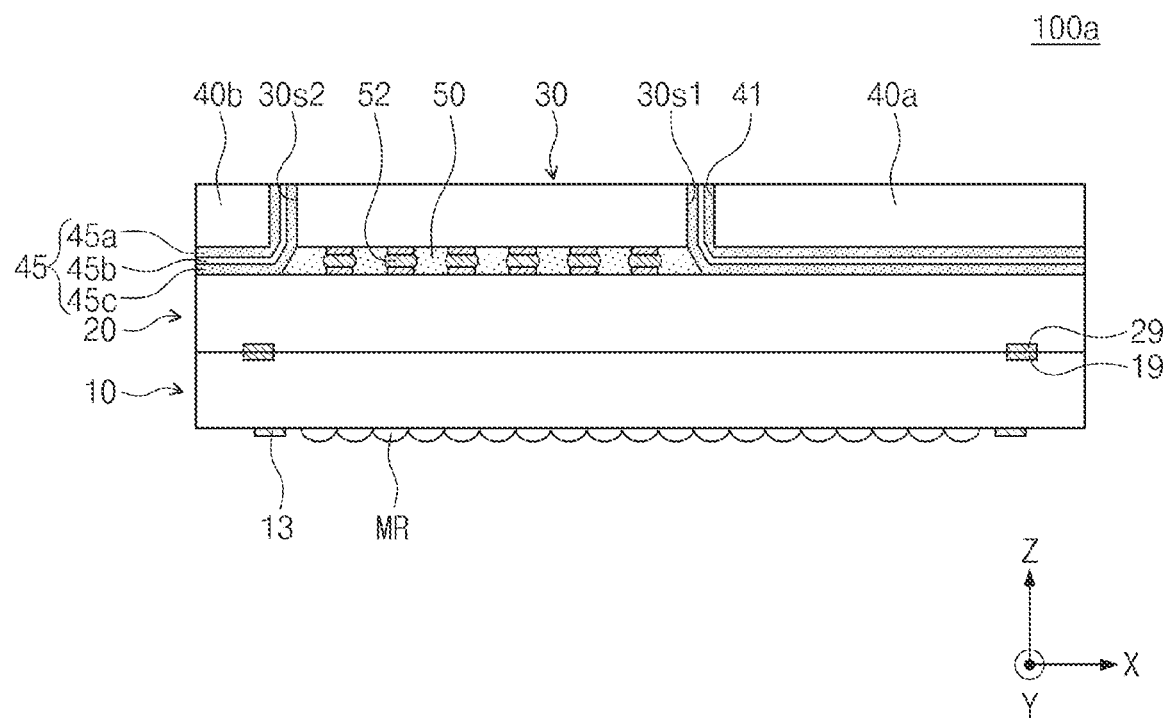
FIGS. 5A, 5B and 5C are each a cross-sectional view of a respective example of a semiconductor package according to the present inventive concepts taken in a direction corresponding to that of line A-A' of FIG. 1.
Figure 5B:
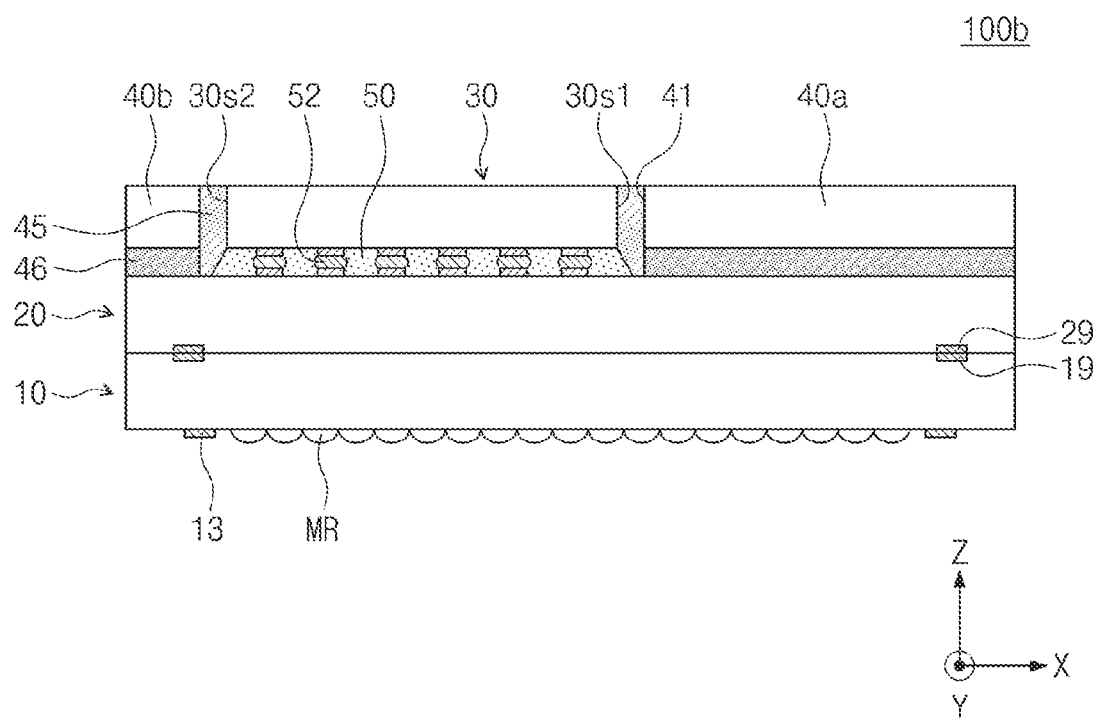
Figure 5C:
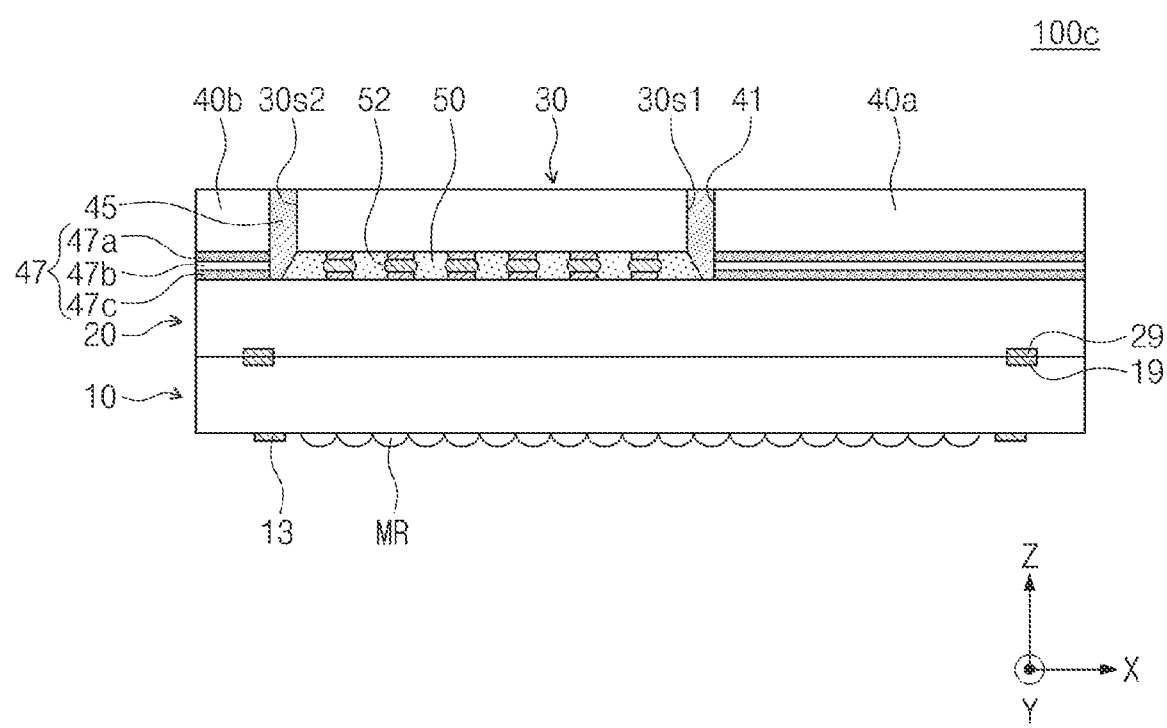

FIGS. 5A to 5C illustrate other versions of semiconductor packages having the same plan view as that shown in FIG. 1, according to the present inventive concepts.

Referring to FIG. 5A, a semiconductor package 100a according to the present inventive concepts includes the resin-containing member 45 in the form of a double-sided tape. The resin-containing member 45 may include a base film 45b, a first adhesive layer 45a on or over the base film 45b, and a second adhesive layer 45c beneath the base film 45b. Other features and aspects of the semiconductor package 100a are similar to those discussed with reference to FIG. 3.

Referring to FIG. 5B, a semiconductor package 100b according to the present inventive concepts includes the resin-containing member 45 in the form of a mold layer or a thermal interface material layer. The resin-containing member 45 is not be interposed between the semiconductor die 40 and the second semiconductor chip 20. Instead, an adhesive layer 46 is interposed between the semiconductor die 40 and the second semiconductor chip 20. Other features and aspects of the semiconductor package 100b are similar to those discussed with reference to FIG. 3.

Referring to FIG. 5C, a semiconductor package 100c according to the present inventive concepts includes the resin-containing member 45 in the form of a mold layer or a thermal interface material layer. The resin-containing member 45 is not be interposed between the semiconductor die 40 and the second semiconductor chip 20. Instead, a double-sided tape 47 is interposed between the semiconductor die 40 and the second semiconductor chip 20. The double-sided tape 47 may include a base film 47b, a first adhesive layer 47a on or over the base film 47b, and a second adhesive layer 47c beneath the base film 47b. Other features and aspects of the semiconductor package 100c are similar to those discussed with reference to FIG. 3.

FIGS. 6A to 6L illustrate a method of fabricating a semiconductor package of the type shown in FIGS. 1 and 3.

Figure 6A:
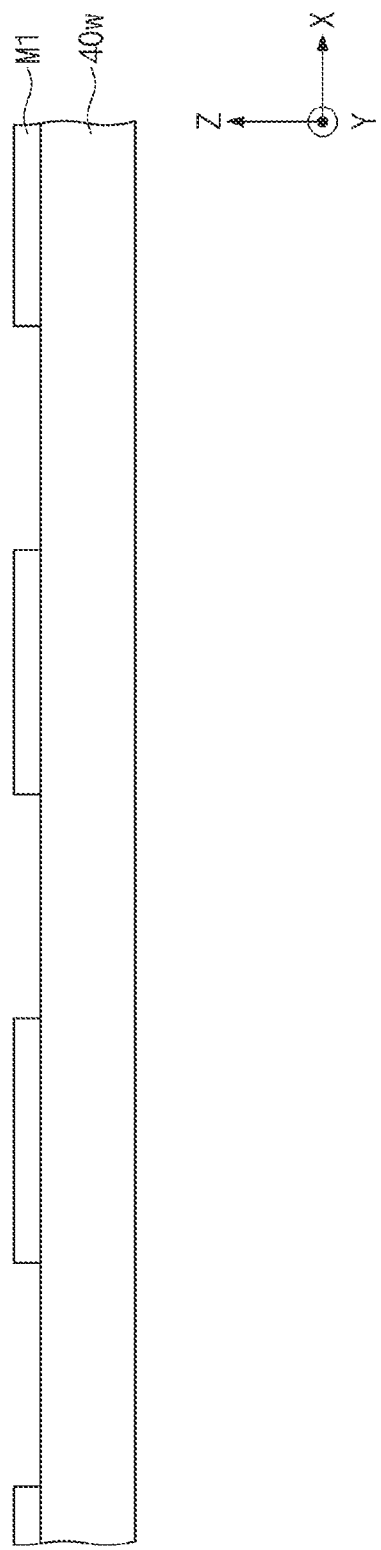

Referring to FIG. 6A, a semiconductor die wafer 40w may be prepared so as to form the semiconductor die (see 40 of FIG. 1). The semiconductor die wafer 40w may be, for example, a single crystalline silicon wafer. A mask pattern M1 may be formed on the semiconductor die wafer 40w, defining openings 41 which will be discussed below with reference to FIGS. 6H and 6I. The mask pattern M1 may be, for example, a photoresist pattern.

Figure 6B:
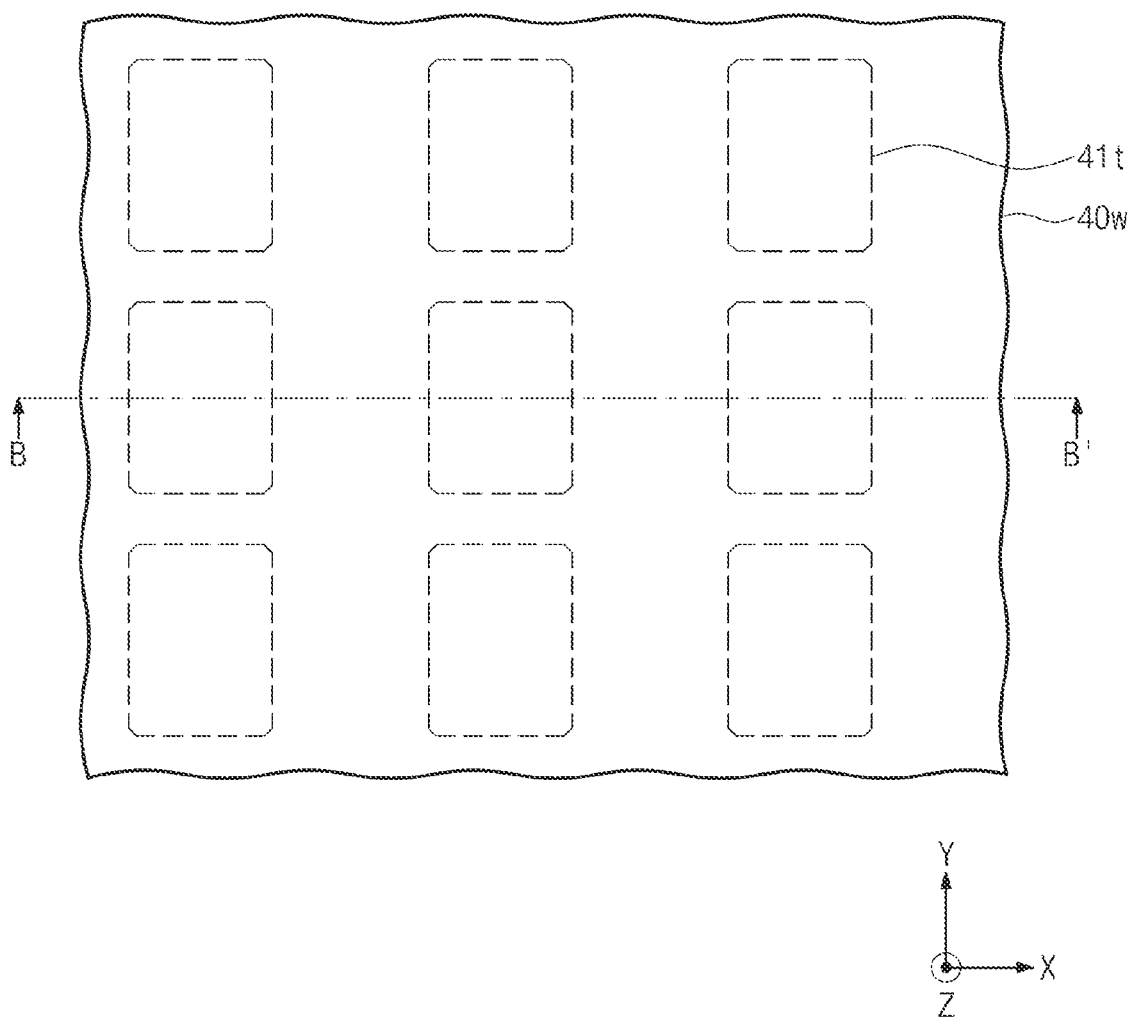
Figure 6C:
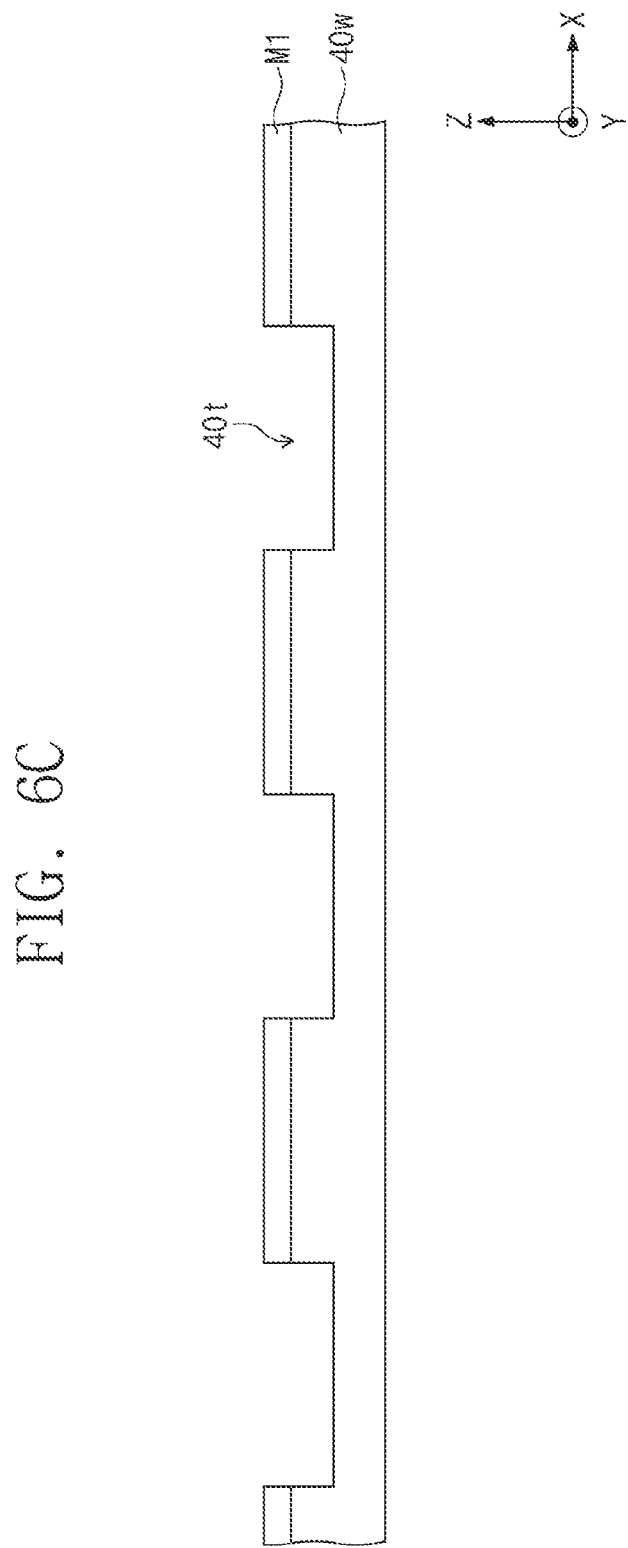

Referring to FIGS. 6B and 6C, the mask pattern M1 may be used as an etching mask to etch the semiconductor die wafer 40w to form a plurality of trenches 41t that are spaced apart from each other. After that, the mask pattern M1 may be removed.

Figure 6D:
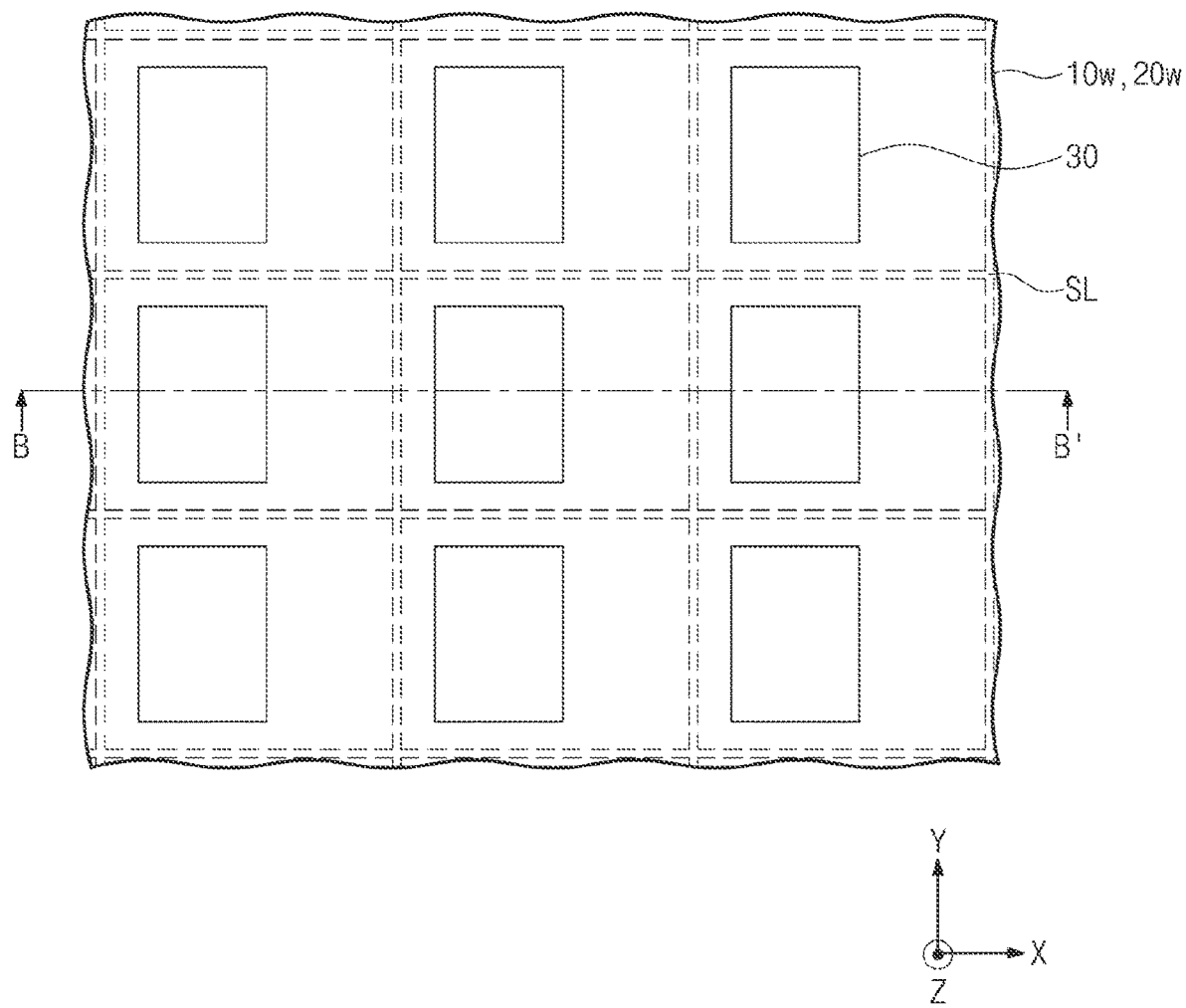

Referring to FIGS. 6D and 6E, a first semiconductor chip wafer 10w and a second semiconductor chip wafer 20w may be prepared. Each of the first and second semiconductor chip wafers 10w and 20w may include chip regions CR and a scribe lane region SL between the chip regions CR. The structures discussed with reference to FIG. 4 may be formed on each of the chip regions CR of the first semiconductor chip wafer 10w. The structures discussed with reference to FIG. 4 may be formed on each of the chip regions CR of the second semiconductor chip wafer 20w.

The first and second semiconductor chip wafers 10w and 20w may be attached to each other. In this case, the scribe lane regions SL may be vertically juxtaposed with each other. In order to attach the first and second semiconductor chip wafers 10w and 20w to each other, a plasma treatment may be performed on a surface of one or more of the first and second semiconductor chip wafer 10w and 20w, and then a thermo-compression process may be performed while the first and second semiconductor chip wafers 10w and 20w are in contact with each other. A sacrificial substrate 70 may be attached to the bottom of the first semiconductor chip wafer 10w. The sacrificial substrate 70 may be a protective layer or a carrier substrate. The sacrificial substrate 70 may protect the micro-lens array MR.

Connection members 52 may be used to bond third semiconductor chips 30 onto the second semiconductor chip wafer 20w. An under-fill layer 50 may be formed between each of the third semiconductor chips 30 and the second semiconductor chip wafer 20w.

Figure 6F:
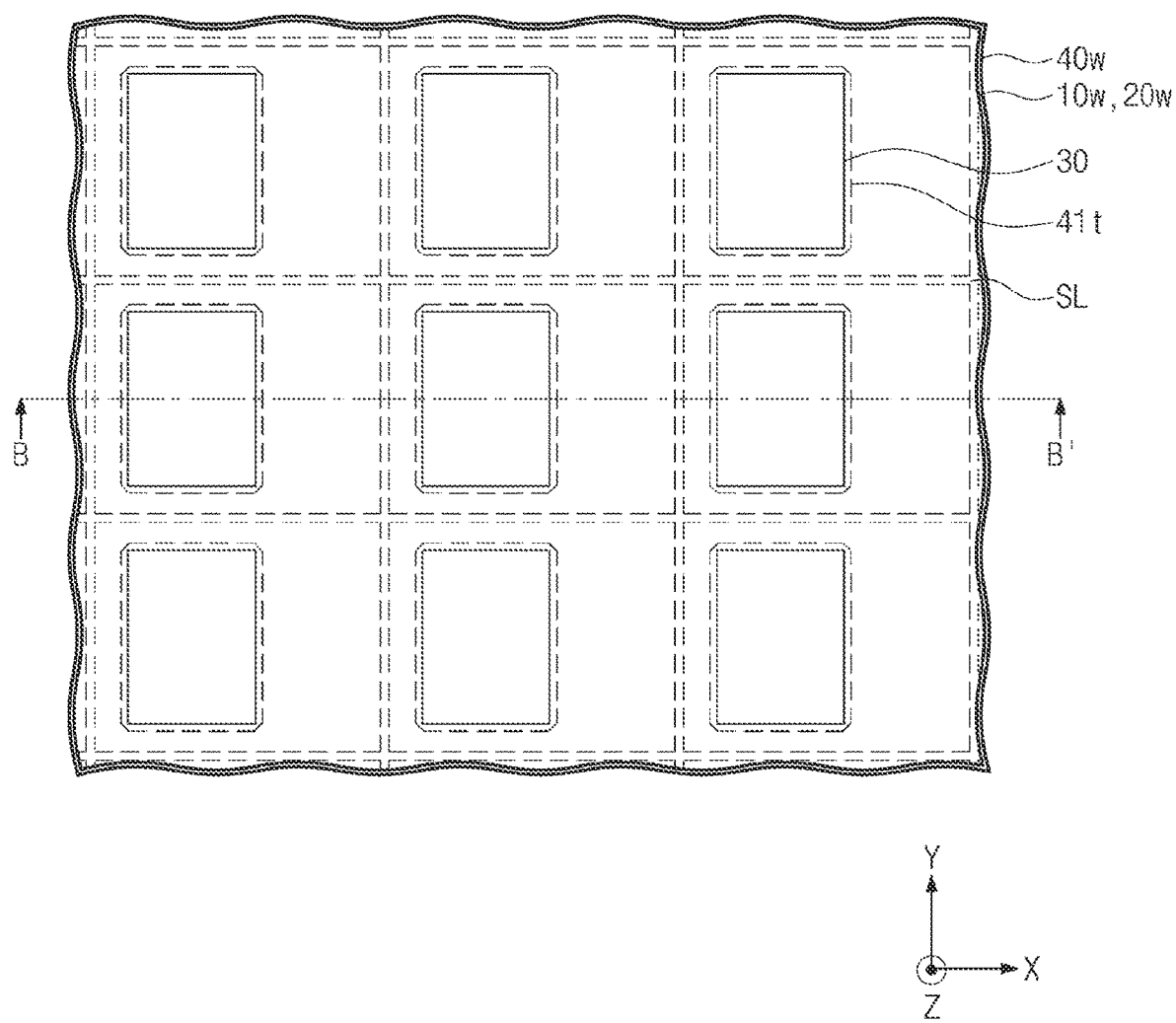
Figure 6G:
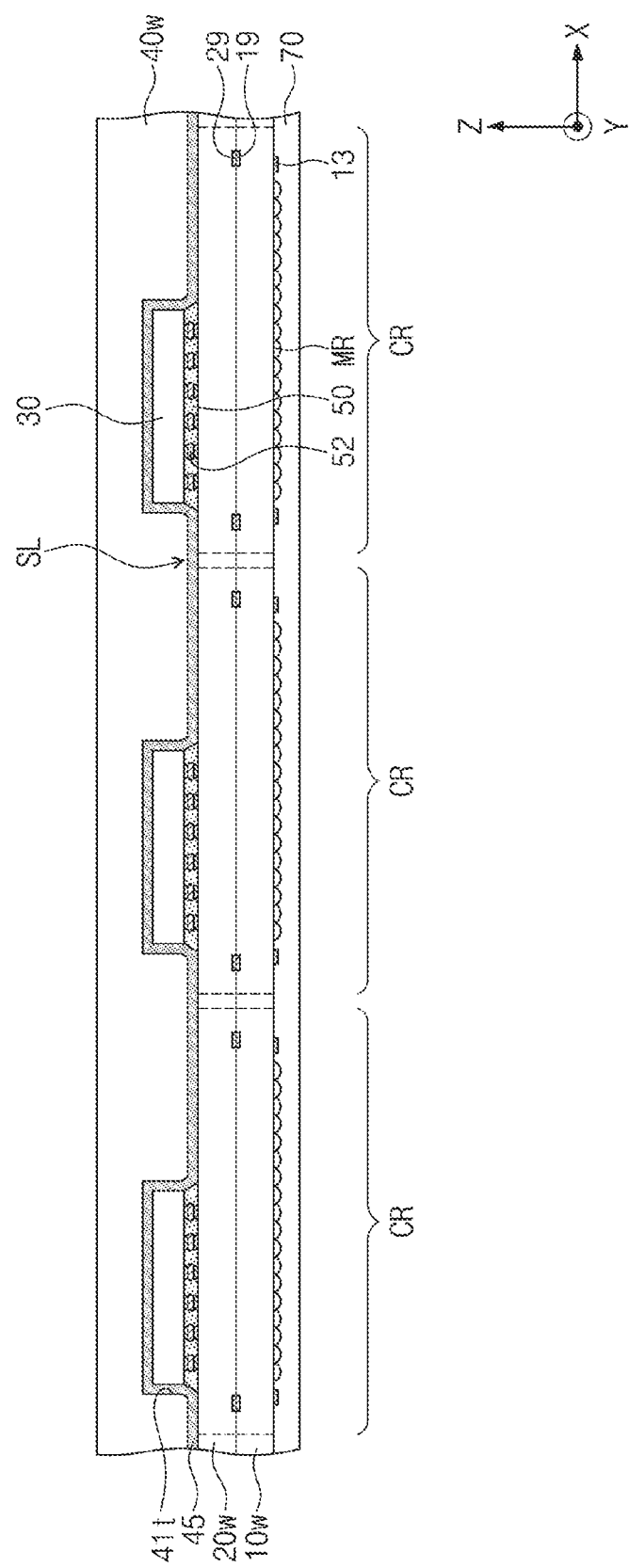

Referring to FIGS. 6F and 6G, the semiconductor die wafer 40w fabricated at the step of FIG. 6C may be turned upside down and placed on the second semiconductor chip wafer 20w. The semiconductor die wafer 40w may be attached to the second semiconductor chip wafer 20w with a resin-containing member 45. At this stage, the third semiconductor chips 30 may be inserted into the trenches 41t of the semiconductor die wafer 40w.

Figure 6H:
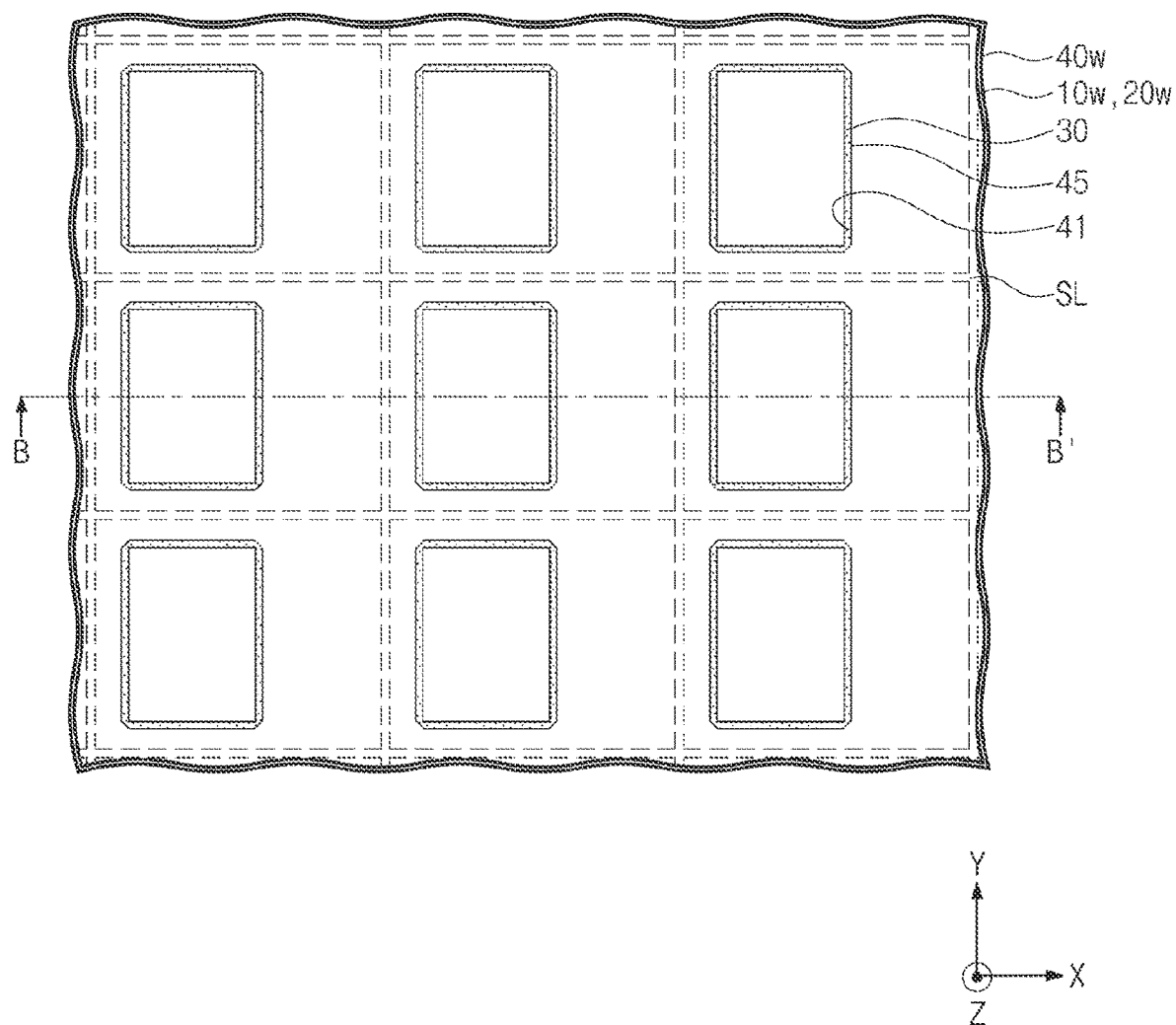

Referring to FIGS. 6H and 6I, a chemical mechanical polishing process may be performed to remove an upper portion of the semiconductor die wafer 40w and also to partially remove the resin-containing member 45 on the third semiconductor chips 30, and as a result, openings 41 may be formed, and the resin-containing member 45 and top surfaces of the third semiconductor chips 30 may be exposed. Portions of the third semiconductor chips 30 may also be polished and removed.

Referring to FIG. 6J, a resultant structure of FIG. 6I may be turned upside down to cause the sacrificial substrate 70 to face upward. The sacrificial substrate 70 may be removed to expose an upper portion of the first semiconductor chip wafer 10w.

Figure 6K:
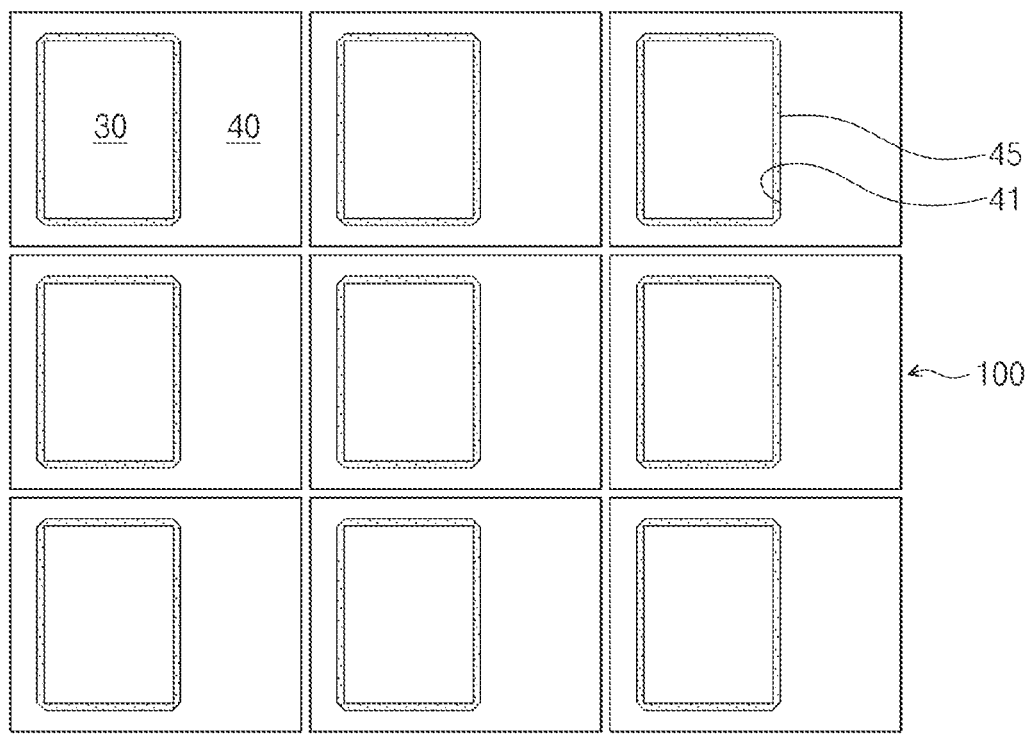

Referring to FIGS. 6K and 6L, a singulation process may be performed to form semiconductor packages 100. For example, a laser drill may be used to remove the scribe lane regions SL of the first and second semiconductor chip wafers 10w and 20w, and successively to remove portions of the resin-containing member 45 and the semiconductor die wafer 40w that overlap the scribe lane regions SL, which may result in the forming of the semiconductor packages 100 that are separated from each other.

In a method of fabricating a semiconductor package according to the present inventive concepts, because the singulation process is performed to form the semiconductor package 100 including the semiconductor die (see 40 of FIG. 1), the method is simple and the manufacturing yield high compared to a case in which a semiconductor die is separately formed and attached. Moreover, the semiconductor die 40 may enhance the mechanical strength of the semiconductor package 100, increase heat dissipation in the semiconductor package 100, and suppress warping of the semiconductor package 100, which result in a reduction in defects of the semiconductor package 100.

Figure 7:
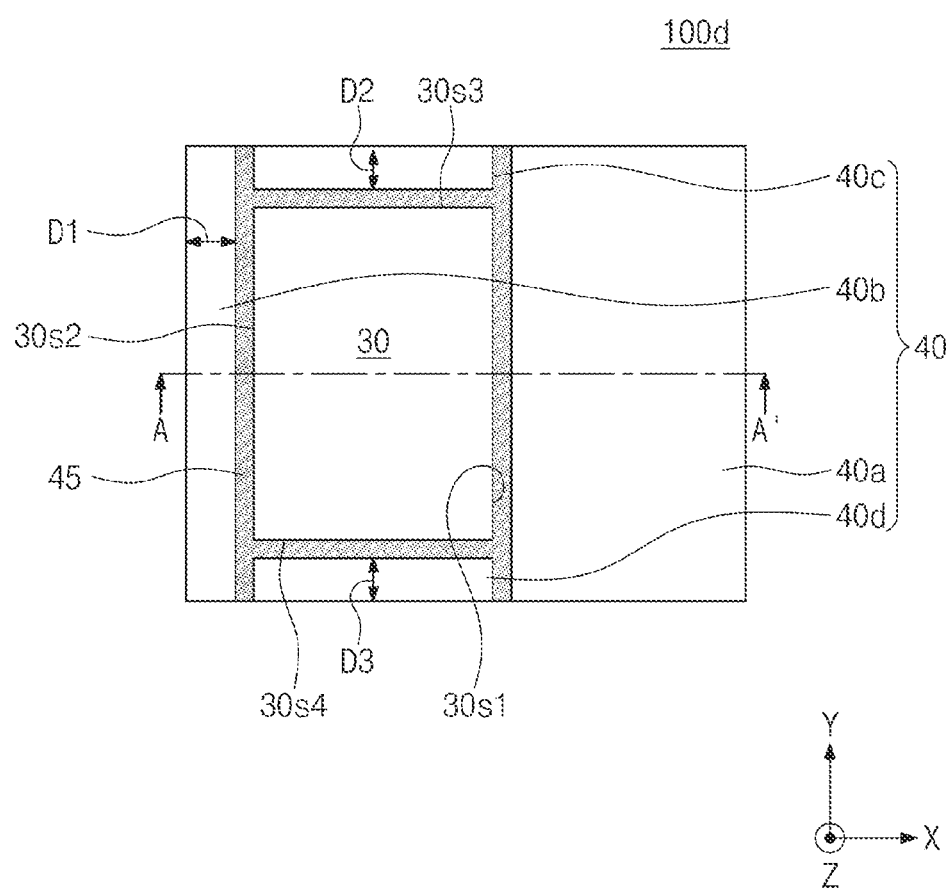
FIG. 7 is a plan view of another example of a semiconductor package according to the present inventive concepts.

FIG. 7 illustrates another example of a semiconductor package according to the present inventive concepts.

Referring to FIG. 7, a semiconductor package 100d according to the present inventive concepts is configured such that the semiconductor die 40 includes first, second, third, and fourth semiconductor structures 40a, 40b, 40c, and 40d spaced apart from each other. The resin-containing member 45 is interposed between the first, second, third, and fourth semiconductor structures 40a, 40b, 40c, and 40d. Side surfaces of the first semiconductor structure 40a, the second semiconductor structure 40b, the third semiconductor structure 40c, and the resin-containing member 45 may constitute side surfaces of the semiconductor package 100d. The second semiconductor structure 40b has a width D1 parallel to the first direction X. The third semiconductor structure 40c has a width D2 parallel to the second direction Y intersecting the first direction X. The fourth semiconductor structure 40d has a width D3 parallel to the second direction Y. Each of the first, second, and third widths D1, D2, and D3 may be, for example, equal to or greater than about 100 μm, such that the semiconductor package 100d may have sufficient mechanical strength and efficiently radiate heat. The cross section of the semiconductor package 100d taken along line A-A' of FIG. 7 may be similar to the cross-section of the package shown in FIG. 5B. Other aspects and features of the semiconductor package 100d may be similar to those discussed with reference to FIG. 1.

Figure 8:
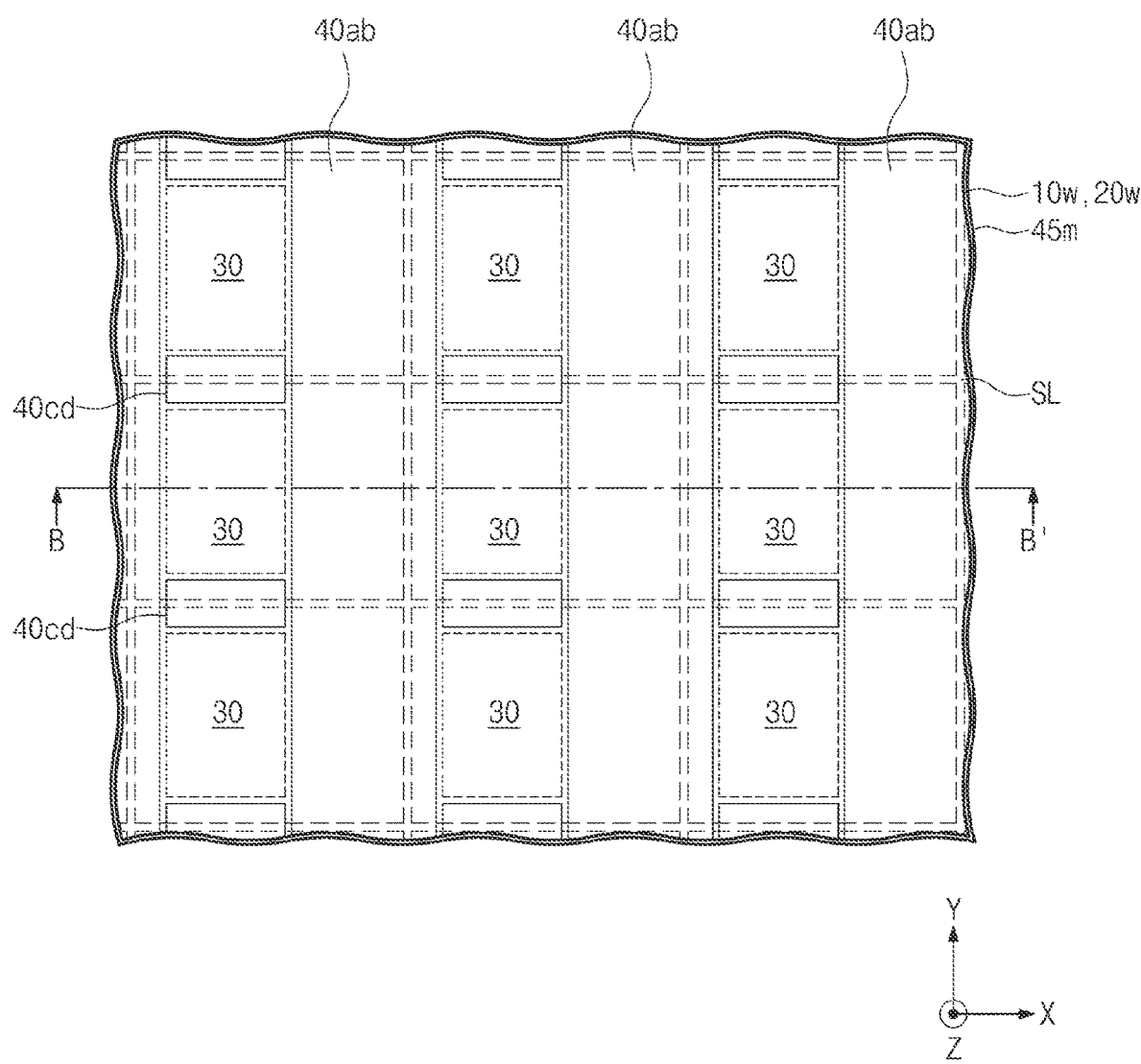
FIG. 8 is a plan view of semiconductor packages have cross sections similar to that shown in FIG. 7, during their course of manufacture for use in illustrating another example of a method of fabricating semiconductor packages according to the present inventive concepts.
Figure 9:
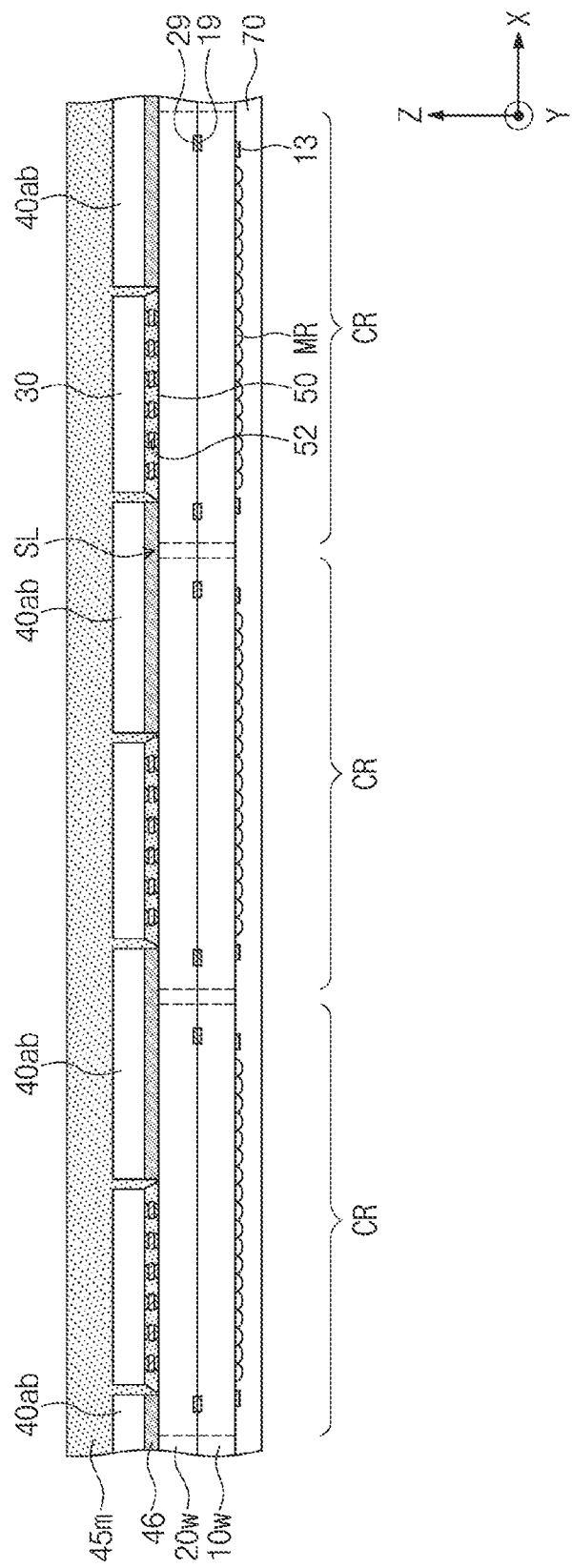
FIG. 9 is a cross-sectional view taken along line B-B' of FIG. 8.

FIGS. 8 and 9 show a characteristic step in a method of fabricating a semiconductor package of the type having the cross section of FIG. 7. Other steps in the method are similar to those discussed with reference to FIGS. 6A-6L, as will be made clearer from the description of the method below.

Referring to FIGS. 8 and 9, an adhesive layer 46 may be used to attach first semiconductor die preliminary patterns 40*ab* and second semiconductor die preliminary patterns 40*cd*, which preliminary patterns 40*ab* and 40*cd* are spaced apart from each other, to a resultant structure shown in FIGS. 6D and 6E. The first semiconductor die preliminary patterns 40*ab* may be spaced apart in the first direction X from each other across the third semiconductor chips 30. The first semiconductor die preliminary patterns 40*ab* may have linear shapes that extend longitudinally in the second direction Y intersecting the first direction X. The first semiconductor die preliminary patterns 40*ab* may be disposed to overlap the scribe lane regions SL. The second semiconductor die preliminary patterns 40*cd* may be spaced apart in the second direction Y from each other across the third semiconductor chips 30. The second semiconductor die preliminary patterns 40*cd* may also be disposed to overlap the scribe lane regions SL. After the attaching of the first and second semiconductor die preliminary patterns 40*ab* and 40*cd*, a mold layer 45*m* may be formed to cover the first semiconductor die preliminary patterns 40*ab*, the second semiconductor die preliminary patterns 40*cd*, and the third semiconductor chips 30. The mold layer 45*m* may fill spaces among the first semiconductor die preliminary patterns 40*ab*, the second semiconductor die preliminary patterns 40*cd*, and the third semiconductor chips 30. Subsequently, a chemical mechanical polishing process may be performed to expose top surfaces of the first semiconductor die preliminary patterns 40*ab*, the second semiconductor die preliminary patterns 40*cd*, and the third semiconductor chips 30, and then a singulation process may be performed to complete the fabricating of a semiconductor package 100*d* of a type having a plan view shown in FIG. 7 and a cross-sectional view identical or similar to that shown in FIG. 5B. The singulation process may cut the first semiconductor die preliminary pattern 40*ab* into a first semiconductor structure 40*a* and a second semiconductor structure 40*b*, as shown in FIG. 1. In addition, the second semiconductor die preliminary pattern 40*cd* may be cut into a third semiconductor structure 40*c* and a fourth semiconductor structure 40*d*, as shown in FIG. 1.

Figure 10:
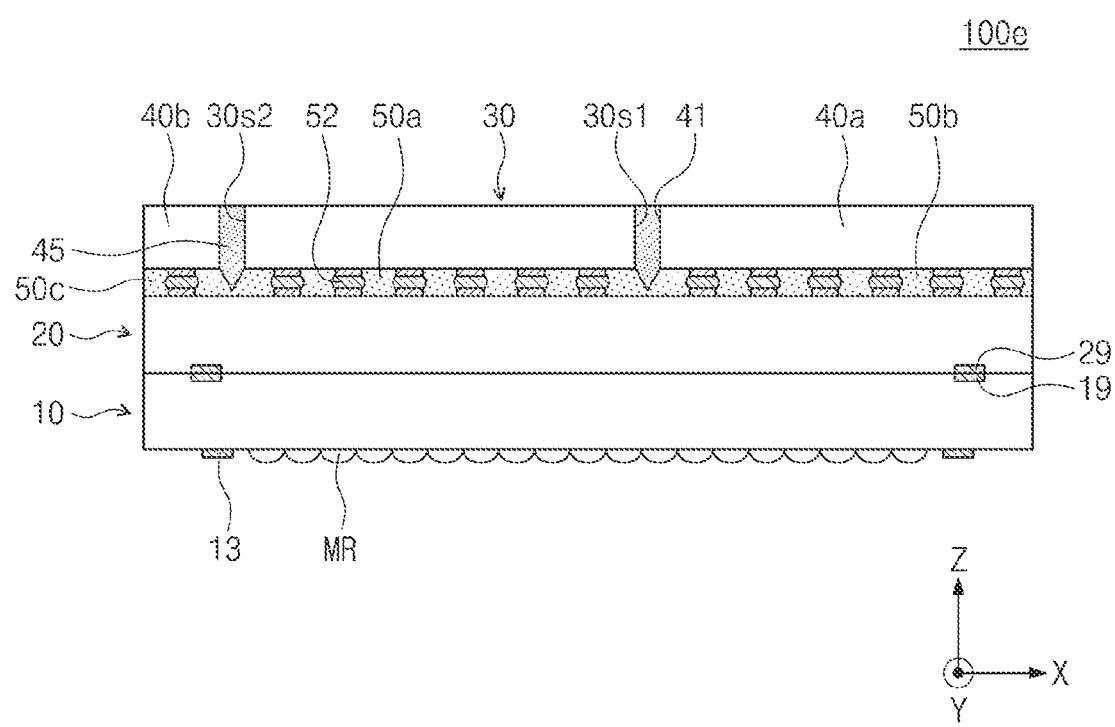
FIG. 10 is a cross-sectional view of another example of a semiconductor package according to the inventive concept taken in a direction corresponding to that of line A-A' of FIG. 1.
Figure 11:
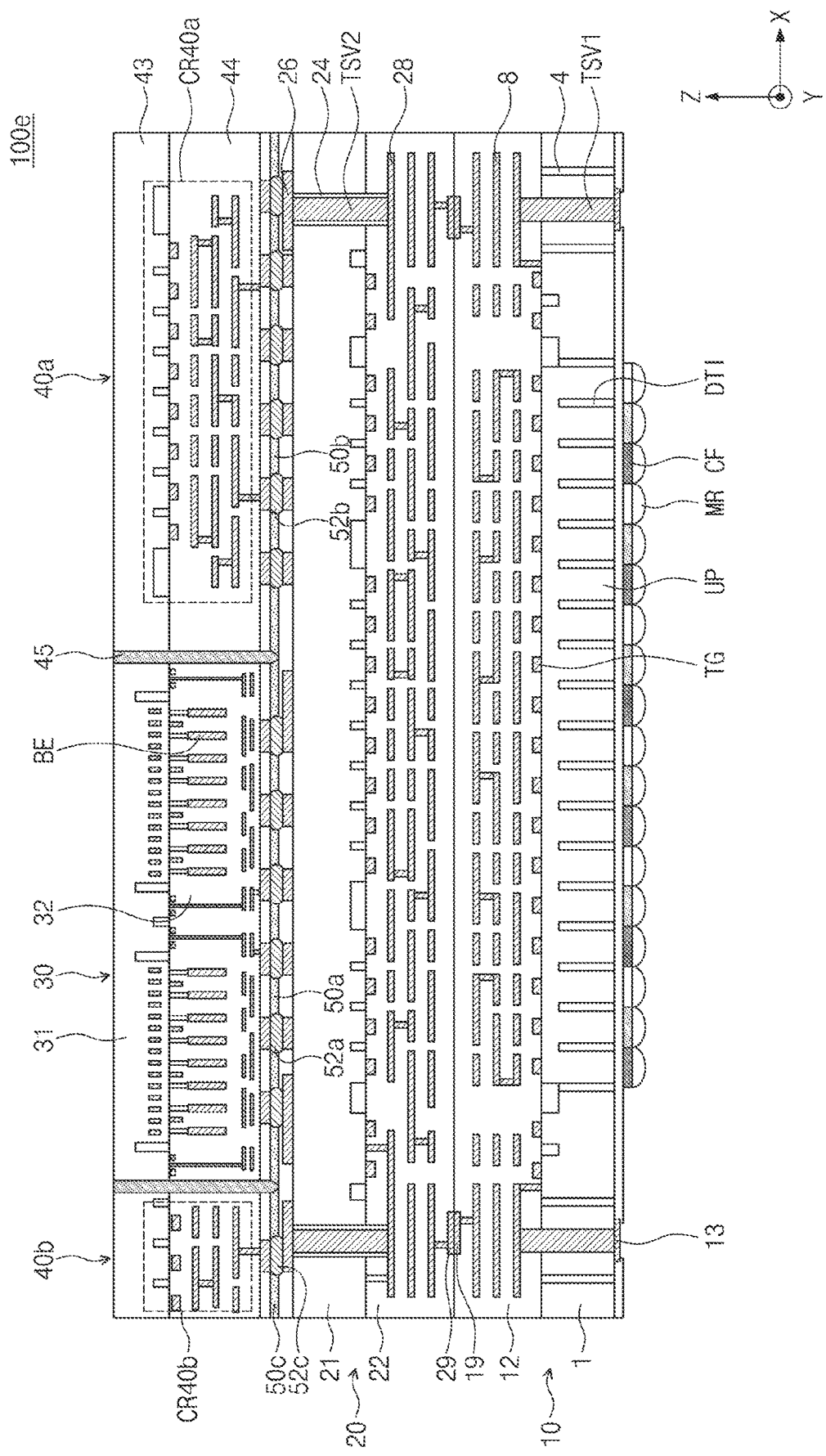
FIG. 11 is a detailed view of FIG. 10.

FIGS. 10 and 11 illustrate another example of a semiconductor package according to the present inventive concepts.

Referring to FIGS. 10 and 11, a semiconductor package 100*e* according to the present inventive concepts is configured such that the semiconductor die (see 40 of FIG. 1) is electrically connected to the second semiconductor chip 20 through a second connection member 52*b* and a third connection member 52*c*. For example, the third semiconductor chip 30 may be electrically connected through a first connection member 52*a* to the second semiconductor chip 20. A first under-fill layer 50*a* may be interposed between the second and third semiconductor chips 20 and 30. The second connection member 52*b* and a second under-fill layer 50*b* may be interposed between the second semiconductor chip 20 and the first semiconductor structure 40*a* of the semiconductor die 40. The third connection member 52*c* and a third under-fill layer 50*c* may be interposed between the second semiconductor chip 20 and the second semiconductor structure 40*b* of the semiconductor die 40. The semiconductor die 40 may include a semiconductor die substrate 43 and a semiconductor die interlayer dielectric layer 44. The semiconductor die 40 may be electrically connected to the second semiconductor chip 20. For example, a first circuit portion CR40*a* and a second circuit portion CR40*b* may be disposed in the semiconductor die 40. The first circuit portion CR40*a* may be disposed in the first semiconductor structure 40*a*. The second circuit portion CR40*b* may be disposed in the second semiconductor structure 40*b*. Each of the first and second circuit portions CR40*a* and CR40*b* may include a plurality of transistors and a plurality of wiring lines. The first and second circuit portions CR40*a* and CR40*b* may be electrically connected to each other. Other aspects and features of the semiconductor package 100*e* may be identical or similar to those discussed with reference to FIGS. 1, 3, and 4.

Figure 12:
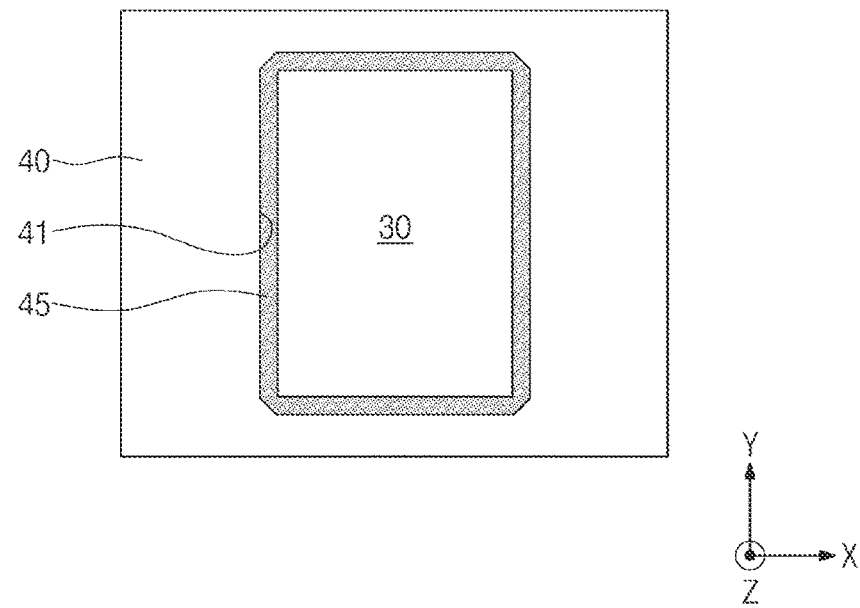
FIGS. 12 and 13 are plan views of examples of semiconductor packages according to the present inventive concepts.
Figure 13:
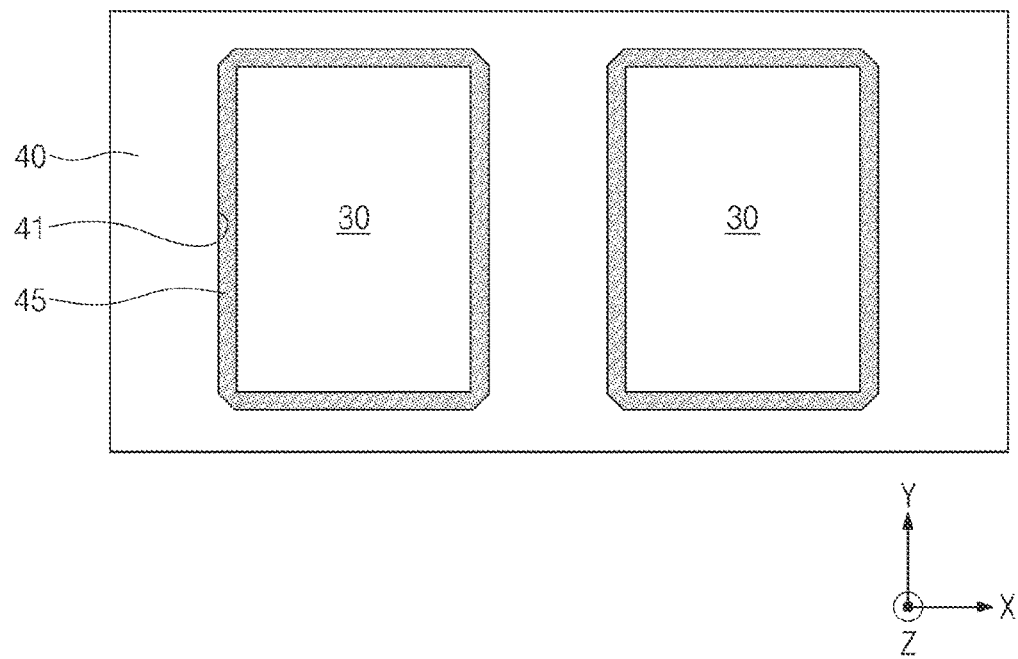

FIGS. 12 and 13 are plan views of other forms of a semiconductor package according to the present inventive concepts.

Referring to FIG. 12, a semiconductor package 100*f* according to the present inventive concepts includes the opening 41 in a central portion of the semiconductor die 40. The third semiconductor chip 30 may be disposed in the opening 41. The third semiconductor chip 30 may have a central axis that coincides with that of the second semiconductor chip 20. Other aspects and features of the semiconductor package 100*f* may be similar to those discussed with reference to FIGS. 1, 3, and 4.

Referring to FIG. 13, a semiconductor package 100*g* according to the present inventive concepts is configured such that the semiconductor die 40 includes a plurality of the openings 41 that are spaced apart from each other. A plurality of the third semiconductor chips 30 may be disposed in the openings 41. FIG. 13 shows two openings 41, but the number of the openings 41 may be three or more. Other aspects and features of the semiconductor package 100*f* may be identical or similar to those discussed with reference to FIGS. 1, 3, and 4.

Figure 14:
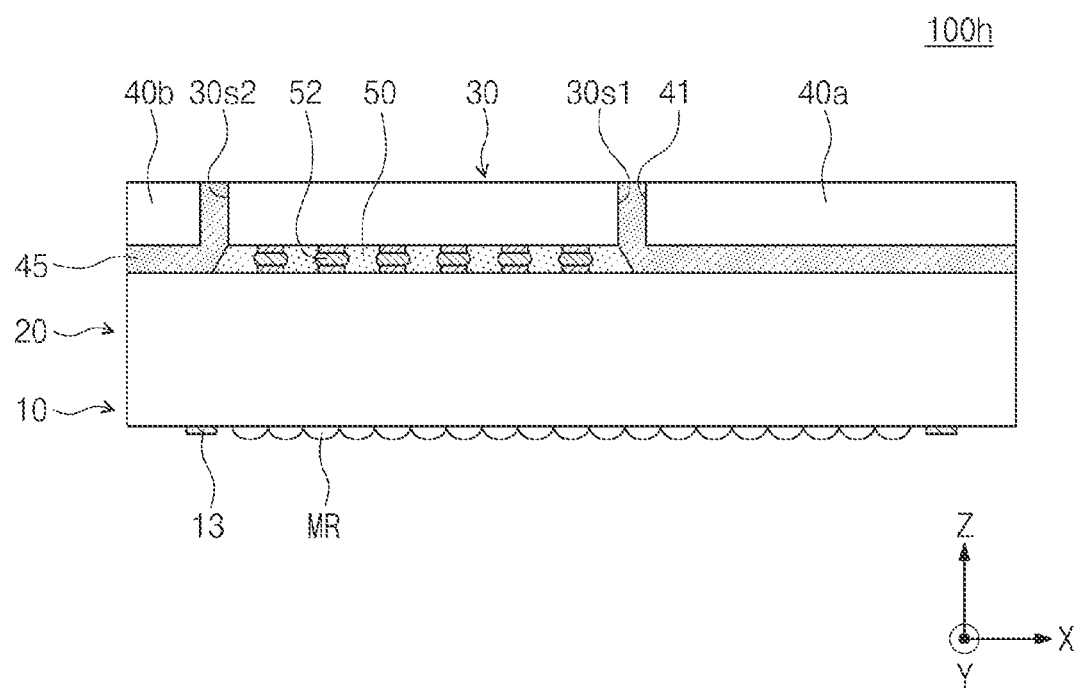
FIG. 14 is a cross-sectional view of an example of a semiconductor package according the present inventive concepts.

FIG. 14 illustrates another example of a semiconductor package according to the present inventive concepts.

Referring to FIG. 14, a semiconductor package 100*h* according to the present inventive concepts does not include the second semiconductor chip 20 of the previously described examples. The third semiconductor chip 30 may be electrically connected through the connection member 52 to the first semiconductor chip 10. The resin-containing member 45 may be interposed between the semiconductor die 40 and the third semiconductor chip 30. The resin-containing member 45 may be interposed between the semiconductor die 40 and the first semiconductor chip 10. Other aspects and features of the semiconductor package 100*g* may be identical or similar to those discussed with reference to FIGS. 1, 3, and 4.

Accordingly, semiconductor packages according to the inventive concept may have a lower package structure and an upper package structure stacked on the lower package structure. The lower package structure may include a lower semiconductor chip having a substrate, integrated circuitry at a surface of the substrate, and an interlayer dielectric on the surface of the substrate, e.g., the lower package structure may include the semiconductor chip 20 or the stack of chips 10 and 20. The upper package structure may include the upper semiconductor chip 30, segments 40*a*, 40*b*, 40*c*, 40*d* of the die body of semiconductor material, and the resin-containing member 45 extending circumferentially around the upper semiconductor chip 30 and sandwiched between the upper semiconductor chip 30 and the segments 40*a*, 40*b*, 40*c*, 40*d* of the die body of semiconductor material. The upper semiconductor chip 30 may include the substrate 31, integrated circuitry at a surface of the substrate 31 and electrically connected to the integrated circuitry of the lower semiconductor chip 10 and/or 20, and an interlayer dielectric 32 covering the surface of the substrate 31 of the upper semiconductor chip 30 where the integrated circuitry is provided. The interlayer dielectric 32 of the upper semiconductor chip 30 may be interposed between the substrate 31 of the upper semiconductor chip 30 and the lower package structure.

Figure 15:
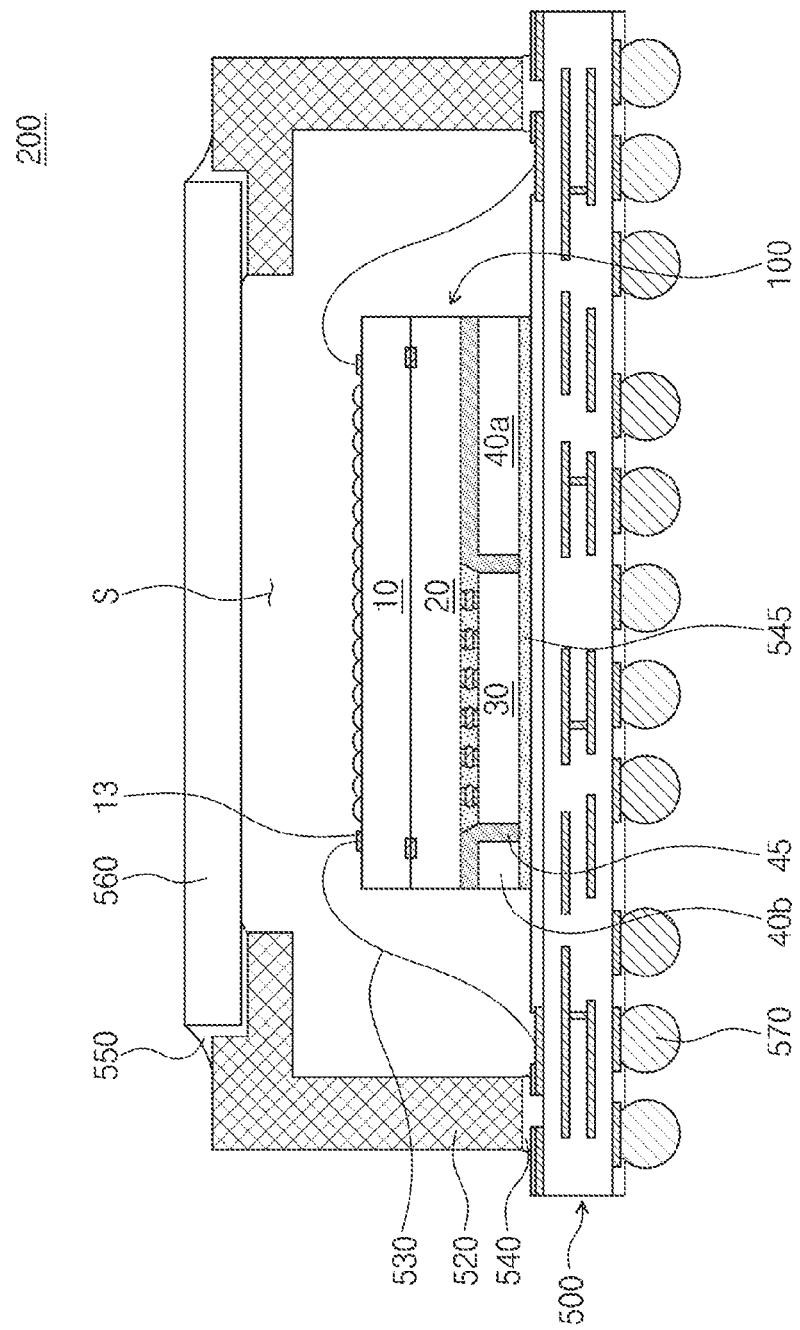
FIG. 15 is a cross-sectional view of an example of a semiconductor package module according to the present inventive concepts.

FIG. 15 illustrates an example of a semiconductor package module comprising a semiconductor package according to the present inventive concepts.

Referring to FIG. 15, a semiconductor package module 200 according to the present inventive concepts is configured such that a first adhesive layer 545 is used to attach the semiconductor package 100 of FIG. 3 upside down to a package substrate 500. The first adhesive layer 545 may be interposed between the third semiconductor chip 30 and the package substrate 500, between the semiconductor die 40 and the package substrate 500, and the resin-containing member 45 and the package substrate 500. A wire 530 may be provided to connect the package substrate 500 to the first lower conductive pad 13 of the first semiconductor chip 10. A holder 520 may be disposed on the package substrate 500. The holder 520 may be spaced apart from the semiconductor package 100. A second adhesive layer 540 may be used to attach the holder 520 to the package substrate 500. The holder 520 may have a closed loop shape in a plan view. The holder 520 may be adjacent to an edge of the semiconductor package 100 and may have a hollow structure. The holder 520 may be formed of a polymeric material, such as polyamide. A third adhesive layer 550 may be used to attach a transparent substrate 560 to the holder 520. The transparent substrate 560 may be formed of transparent glass or plastic. The transparent substrate 560 may be spaced apart from the semiconductor package 100, providing an empty space S. A solder bump 570 may be attached to a lower portion of the package substrate 500. FIG. 15 shows an example in which the semiconductor package 100 of FIG. 3 is employed, but any of other semiconductor packages discussed above may be employed instead of the semiconductor package 100. Alternatively, the semiconductor package module 200 may include a combination of the semiconductor packages discussed above.

A semiconductor package according to the present inventive concepts may be configured such that a semiconductor structure consists of the same semiconductor material as that of semiconductor chips, and that a mold layer has relatively small occupation area or space, which may result in improvement in mechanical strength of the semiconductor package. In addition, because the semiconductor structure has a relatively small thermal expansion coefficient, the semiconductor package may be reduced or prevented from warpage. Furthermore, because the semiconductor structure has a high thermal conductivity, heat may be effectively discharged to reduce the likelihood of malfunction and to increase operating speeds when the semiconductor package is operated. As a result, the semiconductor package may increase in reliability.

A method of fabricating a semiconductor package according to the present inventive concepts may reduce defects and achieve process simplification, thereby improving manufacturing yield.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor package, comprising:
    a first semiconductor chip;
    a second semiconductor chip on the first semiconductor chip;
    a third semiconductor chip and a first semiconductor structure that are on the second semiconductor chip, a top surface of the third semiconductor chip being coplanar with a top surface of the first semiconductor structure, and the first semiconductor structure being spaced apart from the second semiconductor chip; and
    a dielectric layer interposed between the second semiconductor chip and the first semiconductor structure,
    wherein the first semiconductor chip comprises a first semiconductor substrate, a plurality of first interlayer dielectric layers on the first semiconductor substrate, and a first upper terminal on an uppermost one of the first interlayer dielectric layers,
    wherein the second semiconductor chip comprises a second semiconductor substrate, a plurality of second interlayer dielectric layers on a bottom surface of the second semiconductor substrate, and a second lower terminal on a lowermost one of the second interlayer dielectric layers, and
    wherein the second lower terminal is in direct contact with the first upper terminal.

2. The semiconductor package of claim 1, wherein dielectric layer extends between the third semiconductor chip and the first semiconductor structure.

3. The semiconductor package of claim 1, wherein dielectric layer contains resin.

4. The semiconductor package of claim 1, further comprising:
    a second semiconductor structure on the second semiconductor chip and spaced apart from the first semiconductor structure, the third semiconductor chip being interposed between the first semiconductor structure and the second semiconductor structure;
    a third semiconductor structure that connects one end of the first semiconductor structure to one end of the second semiconductor structure; and
    a fourth semiconductor structure that connects another end of the first semiconductor structure to another end of the second semiconductor structure,
    wherein the first to fourth semiconductor structures are integral and collectively constitute a semiconductor die that has an opening therethrough, and
    wherein the third semiconductor chip is disposed in the opening.

5. The semiconductor package of claim 4, wherein the semiconductor die comprises:
    a third semiconductor substrate;
    a plurality of circuit portions on the third semiconductor substrate; and
    a third interlayer dielectric layer that covers the third semiconductor substrate and the circuit portions,
    wherein the semiconductor die is electrically connected to the second semiconductor chip.

6. The semiconductor package of claim 4, wherein, as when viewed in plan, a corner of the opening is rounded or beveled.

7. The semiconductor package of claim 1, wherein, as viewed in plan, a center of the first semiconductor chip does not coincide with a center of the third semiconductor chip.

8. The semiconductor package of claim 1, wherein the dielectric layer extends around the third semiconductor chip.

9. The semiconductor package of claim 1, wherein the first semiconductor chip is an image sensor chip, the second semiconductor chip is a logic chip and the third semiconductor chip is a memory chip.

10. The semiconductor package of claim 1, wherein the third semiconductor chip has first to fourth side surfaces in a clockwise direction, the first side surface being adjacent to the first semiconductor structure,
the semiconductor package further comprises:
a second semiconductor structure adjacent to the second side surface;
a third semiconductor structure adjacent to the third side surface; and
a fourth semiconductor structure adjacent to the fourth side surface,
wherein the first to fourth semiconductor structures are spaced apart from each other.

11. A semiconductor package, comprising:
a first semiconductor chip;
a second semiconductor chip mounted on the first semiconductor chip and having a width less than a width of the first semiconductor chip in a given direction;
a third semiconductor chip between the first semiconductor chip and the second semiconductor chip;
a semiconductor die on the first semiconductor chip and including an opening in which the second semiconductor chip is received; and
a resin-containing member interposed between the third semiconductor chip and the semiconductor die,
wherein the first semiconductor chip comprises a first semiconductor substrate, a plurality of first interlayer dielectric layers on the first semiconductor substrate, and a first upper terminal on an uppermost one of the first interlayer dielectric layers,
wherein the third semiconductor chip comprises a second semiconductor substrate, a plurality of second interlayer dielectric layers on a bottom surface of the second semiconductor substrate, and a second lower terminal on a lowermost one of the second interlayer dielectric layers, and
wherein the second lower terminal is in direct contact with the first upper terminal.

12. The semiconductor package of claim 11, wherein the semiconductor die comprises a semiconductor substrate which does not contain any electrical circuitry.

13. The semiconductor package of claim 11, wherein the semiconductor die comprises:
a semiconductor substrate;
a plurality of circuit portions on the semiconductor substrate; and
an interlayer dielectric layer that covers the semiconductor substrate and the circuit portions,
wherein the semiconductor die is electrically connected to the first semiconductor chip.

14. The semiconductor package of claim 11, wherein, when viewed in plan, a corner of the opening is rounded or beveled.

15. The semiconductor package of claim 11, the semiconductor die is spaced apart and electrically insulated from the third semiconductor chip.

16. A semiconductor package, comprising:
a first semiconductor chip;
a second semiconductor chip mounted on the first semiconductor chip;
a third semiconductor chip mounted on the second semiconductor chip and having a width less than a width of the second semiconductor chip in a given direction;
a semiconductor die on the second semiconductor chip and extending around the third semiconductor chip; and
a resin-containing member interposed between the semiconductor die and the third semiconductor chip,
wherein the first semiconductor chip comprises a first semiconductor substrate, a plurality of first interlayer dielectric layers on the first semiconductor substrate, and a first upper terminal on an uppermost one of the first interlayer dielectric layers,
wherein the second semiconductor chip comprises a second semiconductor substrate, a plurality of second interlayer dielectric layers on a bottom surface of the second semiconductor substrate, and a second lower terminal on a lowermost one of the second interlayer dielectric layers, and
wherein the second lower terminal is in direct contact with the first upper terminal.

17. The semiconductor package of claim 16, wherein the resin-containing member comprises at least one of a mold layer, an adhesive layer, a thermal interface material layer, and a double-sided tape.

18. The semiconductor package of claim 16, wherein the semiconductor die has an opening in which the third semiconductor chip is received, and
when viewed in plan, a corner of the opening is rounded or beveled.

19. The semiconductor package of claim 16, wherein the semiconductor die comprises first to fourth semiconductor structures that are spaced apart from each other.

20. The semiconductor package of claim 16, wherein
the semiconductor die is spaced apart and electrically insulated from the
second semiconductor chip.

* * * * *